(12) United States Patent
Nagai

(10) Patent No.: US 7,331,011 B2
(45) Date of Patent: Feb. 12, 2008

(54) SEMICONDUCTOR INTEGRATED CIRCUIT DEVICE

(75) Inventor: Takeshi Nagai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 440 days.

(21) Appl. No.: 10/870,959

(22) Filed: Jun. 21, 2004

(65) Prior Publication Data

US 2005/0166134 A1    Jul. 28, 2005

(30) Foreign Application Priority Data

Jan. 26, 2004    (JP)    ............... 2004-017333

(51) Int. Cl.
  *G11C 29/00*    (2006.01)
  *H03M 13/00*    (2006.01)
(52) U.S. Cl. .............. 714/773; 714/766; 714/772
(58) Field of Classification Search ........ 714/766, 714/772, 773
See application file for complete search history.

(56) References Cited

U.S. PATENT DOCUMENTS

| 4,918,692 A | * | 4/1990 | Hidaka et al. ............. 714/702 |
| 5,003,542 A | | 3/1991 | Mashiko et al. |
| 5,012,472 A | * | 4/1991 | Arimoto et al. ............. 714/754 |
| 5,056,089 A | * | 10/1991 | Furuta et al. .............. 714/703 |
| 5,056,095 A | * | 10/1991 | Horiguchi et al. .......... 714/765 |
| 5,384,789 A | | 1/1995 | Tomita |
| 5,491,703 A | * | 2/1996 | Barnaby et al. ............. 714/766 |
| 5,555,212 A | | 9/1996 | Toshiaki et al. |
| 5,559,741 A | | 9/1996 | Sobue |
| 5,986,952 A | * | 11/1999 | McConnell et al. ......... 365/200 |
| 6,490,703 B1 | | 12/2002 | de la Iglesia et al. |
| 2003/0000846 A1 | | 1/2003 | Rzeznik et al. |

FOREIGN PATENT DOCUMENTS

| JP | 1-183000 | 7/1989 |
| JP | 5-217398 | 8/1993 |
| JP | 6-85280 | 10/1994 |
| JP | 7-220495 | 8/1995 |
| JP | 8-195099 | 7/1996 |
| JP | 2642094 | 5/1997 |
| JP | 2003-85996 | 3/2003 |

* cited by examiner

*Primary Examiner*—Joseph D. Torres
(74) *Attorney, Agent, or Firm*—Oblon, Spivak, McClelland, Maier & Neustadt, P.C.

(57) ABSTRACT

A semiconductor integrated circuit device includes a first memory cell coupled to a first WL and one of a pair of BLs for information bits, a second memory cell coupled to the first WL and one of a pair of BLs for parity bits, a third memory cell coupled to a second WL and the other of the pair of BLs for information bits, a fourth memory cell coupled to the second WL and the other of the pair of BLs for parity bits, column switches which connect the pair of complementary BLs for parity bits to a pair of data lines for parity bits, and a logic correction circuit connected to one of the pair of data lines for parity bits. The logic correction circuit executes a parity bit rewrite operation.

2 Claims, 28 Drawing Sheets

Extended Hamming Code
⇒
add a parity bit to a
Hamming Code $$G3 = \begin{bmatrix} 1\,0\,0\,0 & 1\,1\,0\,1\,0 \\ 0\,1\,0\,0 & 0\,1\,1\,0\,1 \\ 0\,0\,1\,0 & 0\,0\,1\,1\,1 \\ 0\,0\,0\,1 & 0\,1\,1\,1\,0 \end{bmatrix}$$

A → even, even, even, even
B → odd, odd, odd, odd, odd ⇒ Impossible!
even

FIG. 7

$$G4 = \begin{bmatrix} 1\,0\,0\,0 & 1\,0\,1\,1\,0 \\ 0\,1\,0\,0 & 0\,1\,0\,1\,1 \\ 0\,0\,1\,0 & 1\,1\,0\,0\,1 \\ 0\,0\,0\,1 & 1\,1\,1\,0\,0 \end{bmatrix}$$

A → even, even, even, even
B → odd, odd, odd, odd ⇒ Impossible!
even, even, even

FIG. 8

First write operation

Read operation

Second write operation
(when write mask is present (or #I/O<128 bits))

Third write operation
(when write mask is present (or #I/O<128 bits))

SEMICONDUCTOR INTEGRATED CIRCUIT DEVICE

CROSS-REFERENCE TO RELATED APPLICATIONS

This application is based upon and claims the benefit of priority from prior Japanese Patent Application No. 2004-017333, filed Jan. 26, 2004, the entire contents of which are incorporated herein by reference.

BACKGROUND OF THE INVENTION

1. Field of the Invention

The present invention relates to a semiconductor integrated circuit device and, more particularly, to a semiconductor integrated circuit device having an error correcting circuit (ECC).

2. Description of the Related Art

Among recent semiconductor memories and, for example, dynamic random access memories (DRAMs), semiconductor memories having an error correcting circuit using an error correcting code, e.g., a Hamming code are becoming popular.

In a semiconductor memory with an ECC function, at the time of, e.g., a write operation, parity bits are generated from write data. The write data is written in memory cells as information bits. The parity bits are also written in memory cells.

In a read operation, the parity bits are read out from the memory cells together with the information bits. A syndrome signal is generated from the readout information bits and parity bits. The syndrome signal is input to an error detection circuit. The error detection circuit detects on the basis of the syndrome signal whether the information bits have errors. When an error is detected, an error correcting circuit corrects the information bit error on the basis of the output from the error detection circuit. After the correction, the information bits are output as read data.

In data read out from the memory cells in the initial state and, for example, data read out from the memory cells upon power-on (or immediately after power-on), both the information bits and the parity bits are not always correct code words. In, e.g., a dynamic RAM, charges stored in the memory cells are discharged after power-off. After power-off, data in all memory cells are data corresponding to "no charges", e.g., data "0" at a high probability. When all data read out from the memory cells at the time of power-on are all "0s" (or all "1s"), both the information bits and the parity bits are not always correct code words. As a result, a correct information bit may be corrected on the basis of a wrong parity bit.

Known examples of a semiconductor memory with an ECC are as follows.
1. Japanese Patent No. 2642094
2. Jpn. Pat. Appln. KOKOKU Publication No. 6-85280
3. Jpn. Pat. Appln. KOKAI Publication No. 5-217398
4. Jpn. Pat. Appln. KOKAI Publication No. 1-183000
5. Jpn. Pat. Appln. KOKAI Publication No. 2003-85996
6. Jpn. Pat. Appln. KOKAI Publication No. 8-195099
7. Jpn. Pat. Appln. KOKAI Publication No. 7-220495
8. U.S. Pat. No. 6,490,703

BRIEF SUMMARY OF THE INVENTION

A semiconductor integrated circuit device according to an aspect of the present invention comprises a semiconductor integrated circuit device, comprising: a first word line and a second word line, which are selected on the basis of an address; a pair of complementary bit lines for information bits; a pair of complementary bit lines for parity bits; a first memory cell coupled to the first word line and one of the pair of complementary bit lines for information bits; a second memory cell coupled to the first word line and one of the pair of complementary bit lines for parity bits; a third memory cell coupled to the second word line and the other of the pair of complementary bit lines for information bits; a fourth memory cell coupled to the second word line and the other of the pair of complementary bit lines for parity bits; column switches which connect the pair of complementary bit lines for information bits to a pair of data lines for information bits and the pair of complementary bit lines for parity bits to a pair of data lines for parity bits; and a logic correction circuit connected to one of the pair of data lines for parity bits, the logic correction circuit executing a parity bit rewrite operation in which, on the basis of the address, a logic of data read out from the data lines for parity bits is inverted in a data read operation, and a logic of data to be written in the data lines for parity bits is inverted in a data write operation.

BRIEF DESCRIPTION OF THE SEVERAL VIEWS OF THE DRAWING

FIG. 7 is a view for explaining a problem in use of an extended Hamming code;

FIG. 8 is a view for explaining another problem in use of an extended Hamming code;

DETAILED DESCRIPTION OF THE INVENTION

Figure 1:
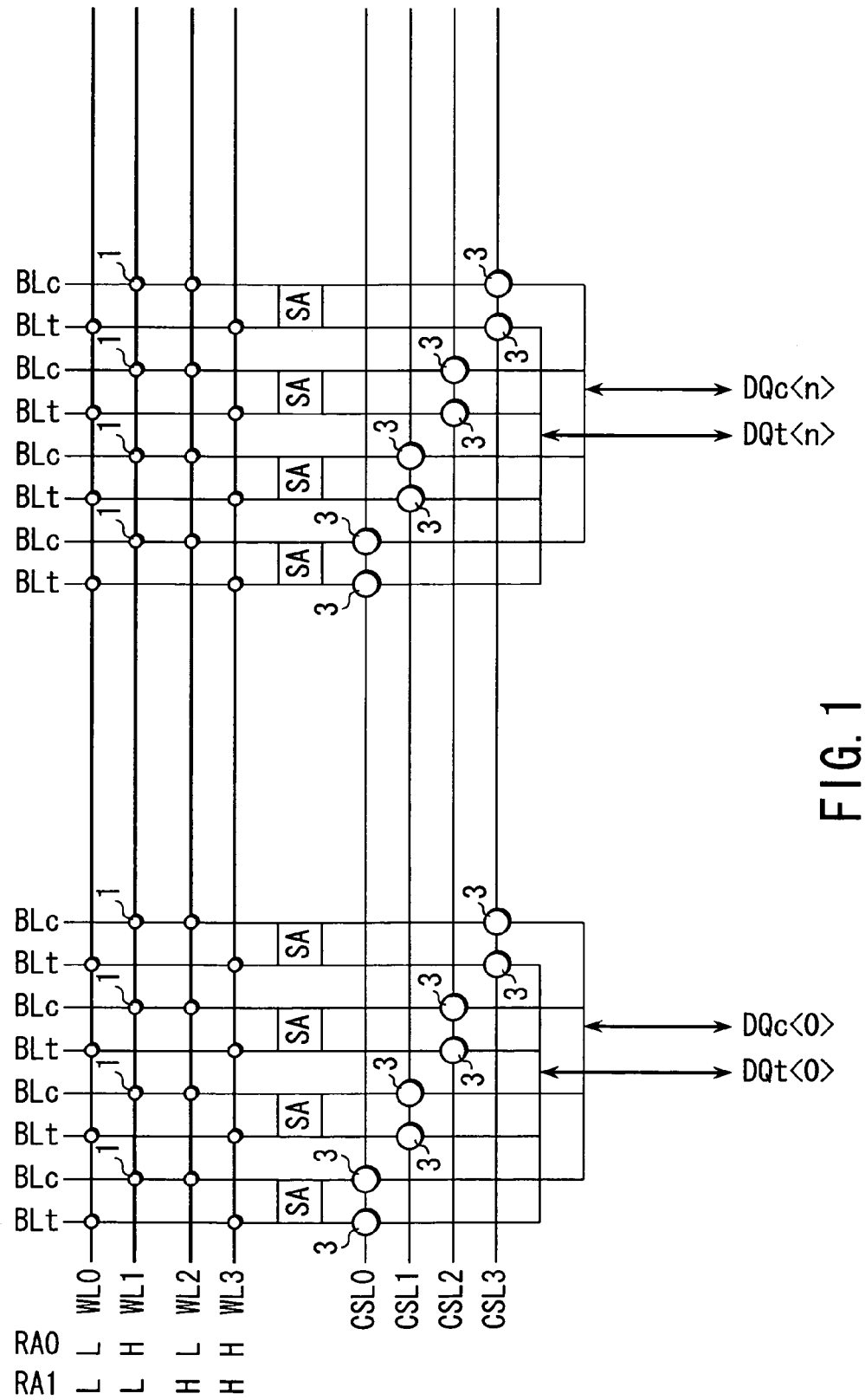
FIG. 1 is a circuit diagram showing an example of the connection relationship between memory cells and DQ lines in a semiconductor integrated circuit device according to the first embodiment of the present invention.

Several embodiments of the present invention will be described below with reference to the accompanying drawing. The same reference numerals denote the same parts throughout the drawings.

FIRST EMBODIMENT

FIG. 1 is a circuit diagram showing an example of the connection relationship between memory cells and DQ lines in a semiconductor integrated circuit device according to the first embodiment of the present invention.

As shown in FIG. 1, memory cells 1 are arranged at the intersections between word lines WL and bit lines BL. More specifically, the memory cells 1 connected to bit lines BLt are connected to word lines WL0 and WL3. The memory cells 1 connected to bit lines BLc are connected to word lines WL1 and WL2. In this example, only four word lines WL are illustrated. However, the number of word lines WL is arbitrary. The four word lines WL are designated by, of address signals given to the memory cell array, addresses which designate rows and, for example, row addresses RA0 and RA1.

A column includes the pair of complementary bit lines BLt and BLc and a sense amplifier SA connected between the bit lines BLt and BLc. Each column is connected to a pair of complementary read and write data lines DQt and DQc through column switches 3. In this specification, the read and write data lines are abbreviated as DQ lines. Column select lines CSL are connected to the gates of the column switches 3. In this example, only four column select lines CSL are illustrated. However, the number of column select lines CSL is arbitrary. The column select lines CSL are designated by, of address signals given to the memory cell array, addresses which designate columns and, for example, column addresses (not shown).

(Read Operation)

In a read, the potential of the selected word line WL changes from, e.g., "L" level to "H" level, and data stored in the memory cells 1 is read out to the pair of bit lines BLt and BLc. The read data is amplified by the sense amplifier SA. Next, the potential of the selected column select line CSL changes from, e.g., "L" level to "H" level to turn on the column switches 3 so that the read data is transmitted to the pair of DQ lines DQt and DQc. After this, the read data is transmitted to an input/output terminal through, e.g., a DQ line sense amplifier (read data line buffer), data bus line, and input/output circuit, although they are not illustrated. The read data is output from the input/output terminal.

(Write Operation)

In a write, write data input to the input/output terminal is transmitted to a write data line buffer through the input/output circuit and data bus line, although they are not illustrated. The write data line buffer drives the pair of DQ lines DQt and DQc to set the potential of the pair of DQ lines DQt and DQc to "0,1" or "1,0" in accordance with the logic of the write data. Next, the potential of the selected column select line CSL changes from, e.g., "L" level to "H" level to turn on the column switches 3 so that the write data is transmitted to the pair of bit lines BLt and BLc. Then, the potential of the selected word line WL changes from, e.g., "L" level to "H" level to store the write data in the memory cells 1.

An example will be described next, in which data is read out from memory cells in the initial state, and error correction is not correctly executed. In this example, error correction is simplified by using, as an error correcting code, a (8,4,3)-Hamming code which is obtained by reducing a (15,11,3)-Hamming code. An (n,k,d)-code means a code having a code length n, information length k, and minimum distance d. It is cumbersome to describe error correction using an actual error correcting code. Actually, any other error correcting code can be used. A generator code G1 of the error correcting code used in this example is given by $$G1 = \begin{bmatrix} 1 & 0 & 0 & 0 & | & 1 & 1 & 0 & 0 \\ 0 & 1 & 0 & 0 & | & 0 & 1 & 1 & 0 \\ 0 & 0 & 1 & 0 & | & 0 & 0 & 1 & 1 \\ 0 & 0 & 0 & 1 & | & 0 & 1 & 1 & 1 \end{bmatrix} \quad (1)$$

Figure 2:
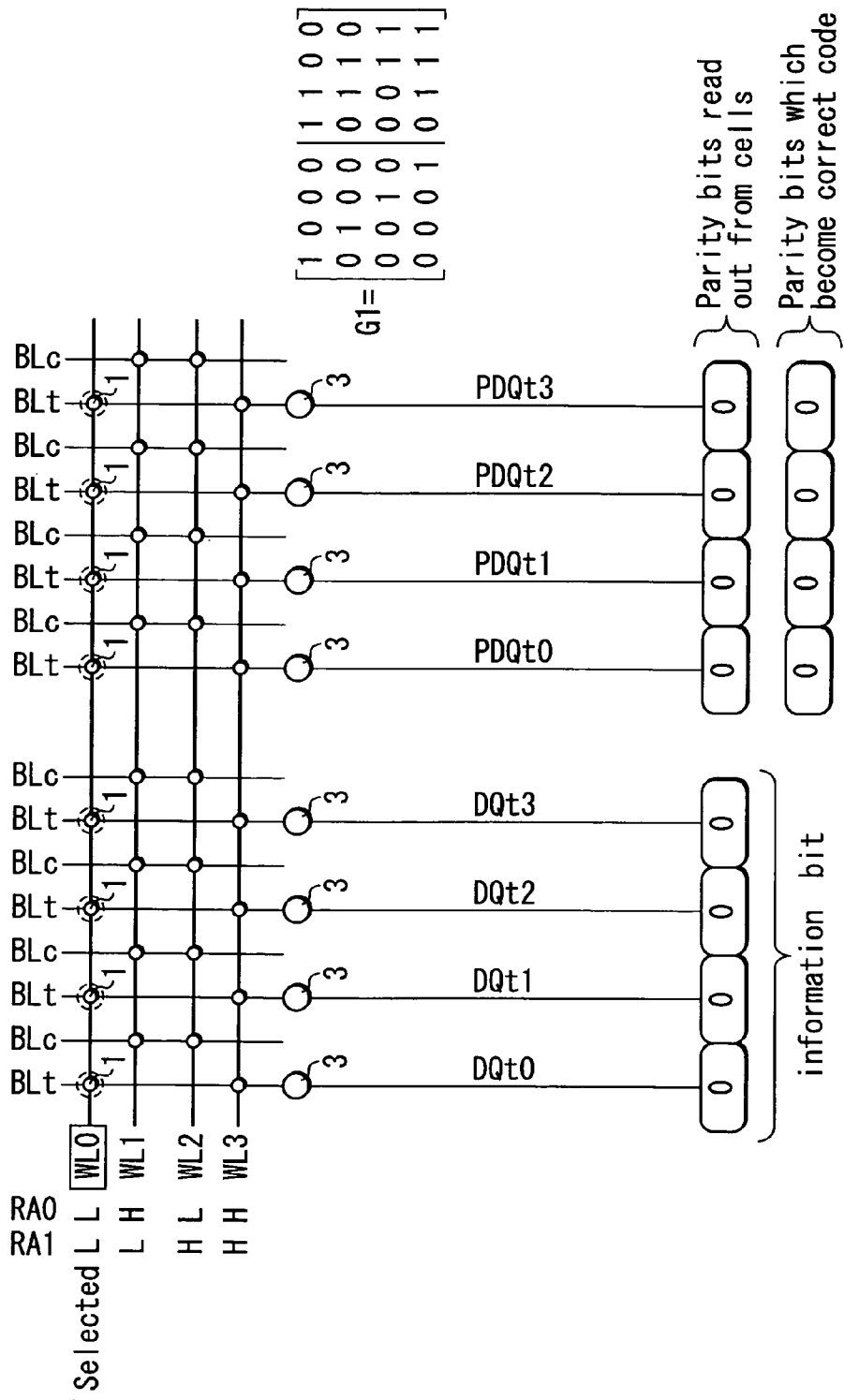
FIG. 2 is a view showing read data transmitted to DQ lines DQt when a word line WL0 is selected.

FIG. 2 is a view showing read data transmitted to the DQ lines DQt when the word line WL0 is selected.

In, e.g., a dynamic random access memory (DRAM), all charges stored in the memory cells 1 are discharged upon power-on. In most cases, this can be regarded as a state in which, for example, data "0" (or data "1") are written.

In this specification, the state upon power-on, in which data corresponding to, e.g., "no charges" are written in all the memory cells 1, will be referred to as the initial state. The initial state is not only defined as the state upon power-on but also includes a state in which data "0" or data "1" are written in all the memory cells 1 when, e.g., clearing all data.

In the initial state, the word line WL0 is selected, and data is read out. Data "0" as in the memory cells 1 appear on all of DQ lines DQt<0:3> corresponding to information bits and DQ lines PDQt<0:3> corresponding to parity bits (FIG. 2). Especially, the parity bits are "0000". This is a correct code word.

In this example, only "true (t)" lines of pairs of DQ lines DQt and DQc are shown. When the word line WL0 is selected, opposite data "1" appear on "complementary (c)" lines.

Figure 3:
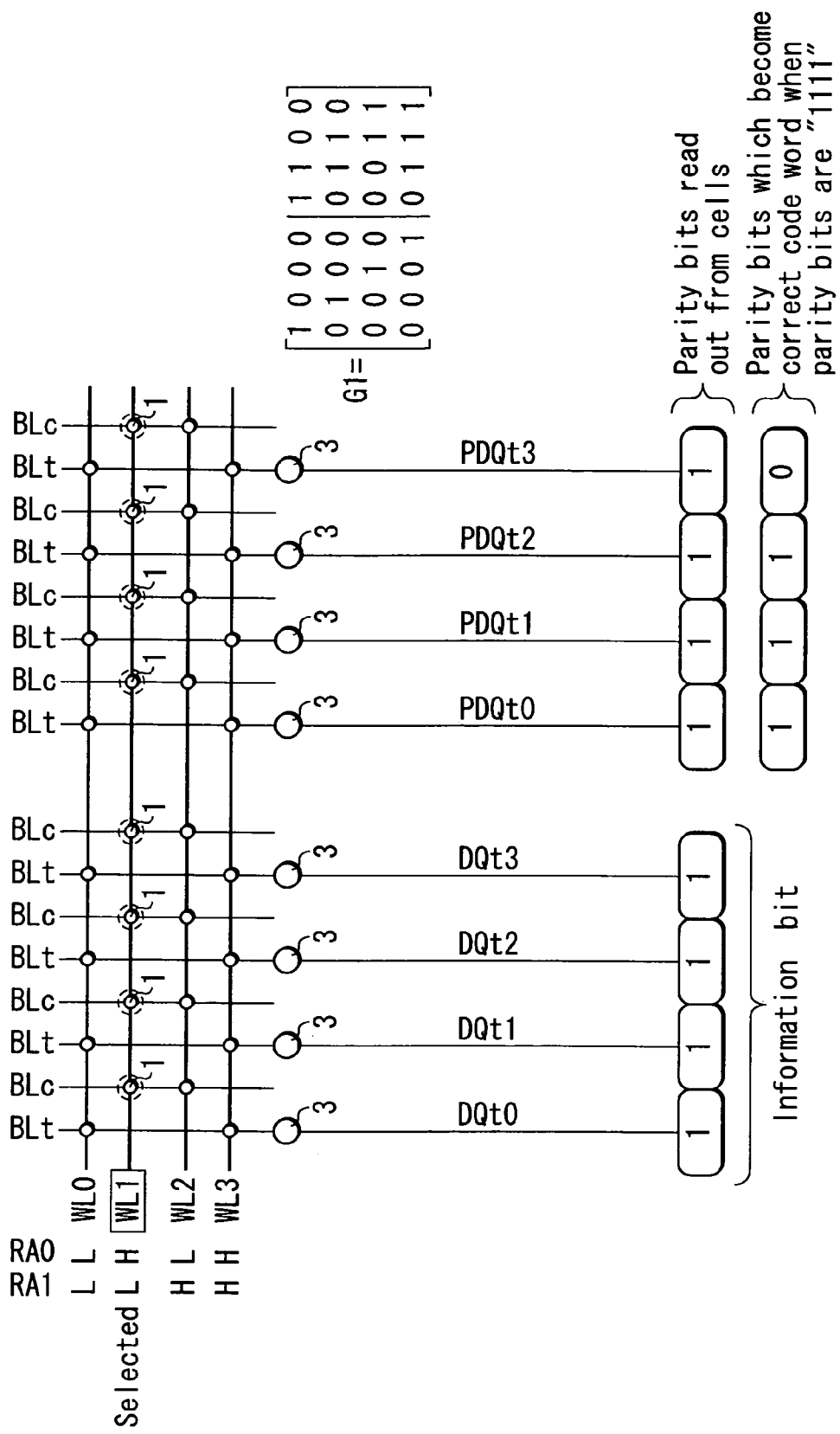
FIG. 3 is a view showing read data transmitted to the DQ lines DQt when a word line WL1 is selected.

FIG. 3 is a view showing read data transmitted to the DQ lines DQt when the word line WL1 is selected in the memory cell layout shown in FIG. 2.

As shown in FIG. 3, assume that data corresponding to "no charges", e.g., data "0" are written in all the memory cells 1. When the word line WL1 which selects the memory cells 1 connected to the bit lines BLc is selected, data "1" opposite to the state in the memory cells 1 appears on all of the DQ lines DQt<0:3> corresponding to the information bits and the DQ lines PDQt<0:3> corresponding to the parity bits. At this time, the parity bits are "1111". This is a wrong code word. When the generator matrix G1 represented by equation (1) is used, the correct code word for information bits "1111" is "1110".

As is apparent from this example, when the parity bits are wrong, the information bits "1111" are rewritten by the error correcting function although they are correct. Since the correct information bits are rewritten, the read data becomes wrong data.

Figure 4:
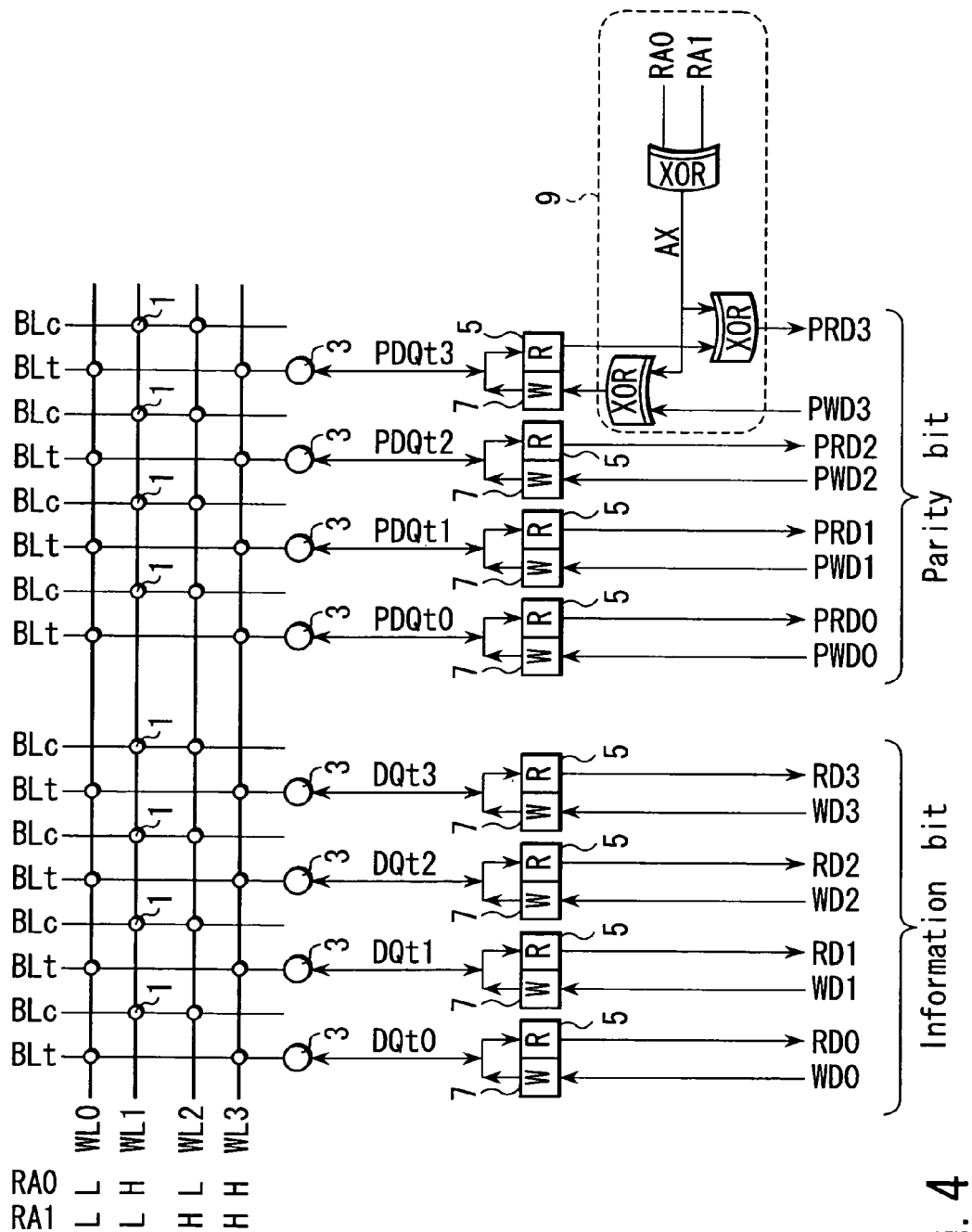
FIG. 4 is a circuit diagram showing an example of the connection relationship between the DQ lines, read data lines, and write data lines in the semiconductor integrated circuit device according to the first embodiment of the present invention.

FIG. 4 is a circuit diagram showing an example of the connection relationship between the DQ lines, read data lines, and write data lines in the semiconductor integrated circuit device according to the first embodiment of the present invention.

As shown in FIG. 4, the layout of the memory cells 1 is the same as in FIG. 1. The same generator matrix G1 as in the reference example is used. The first embodiment is different from the reference example shown in FIG. 1 particularly in that a logic correction circuit 9 is inserted between a read data line buffer (R) 5 and a read data line PRD3 corresponding to a parity bit and between a write data line buffer (W) 7 and a write data line PWD3 corresponding to the parity bit.

The read data line buffer 5 amplifies read data from the memory cell 1, which is amplified by the sense amplifier SA, to drive wiring lines on the output side, e.g., read data lines RD and PRD.

The write data line buffer 7 amplifies write data input to the read data lines RD and PRD to drive the DQ lines DQ and PDQ.

The logic correction circuit 9 adjusts the output logic to the read data line PRD corresponding to a parity bit and, for example, inverts the output logic and also adjusts the input logic from the write data line PWD corresponding to the parity bit and, for example, inverts the logic on the basis of the logics of the row addresses RA0 and RA1.

When the generator matrix G1 represented by equation (1) is used, and word lines which select the memory cells 1 connected to the bit lines BLc are selected, the parity bits indicates a wrong code word. For example, as shown in FIG. 4, word lines which select the memory cells 1 connected to the bit lines BLc are "WL1" and "WL2". Note the row addresses RA0 and RA1 when the word lines WL1 and WL2 are selected. The row addresses RA0 and RA1 when the word lines WL0 and WL3 are selected "coincide". However, the row addresses RA0 and RA1 when the word lines WL1 and WL2 are selected "do not coincide". On the basis of the logic relationship of row addresses RA<0:1> in selecting the word lines WL1 and WL2, the logic correction circuit 9 inverts the output logic to the read data line PRD3 corresponding to a parity bit when the row addresses RA0 and RA1 "do not coincide". The logic correction circuit 9 also inverts the input logic from the write data line PWD3 corresponding to the parity bit and inputs the logic to the write data line buffer 7.

More specifically, when parity bits are read out from, of the memory cells 1 in the initial state, the memory cells 1 connected to the bit lines BLc, the logic correction circuit 9 rewrites the code word "1111" to a correct code word "1110". Accordingly, the problem that the correct information bits "1111" are rewritten by the error correcting function based on the wrong code word can be solved.

In addition, the logic correction circuit 9 rewrites a correct code word given from the write data line PWD3 corresponding to the parity bit in a read in a normal operation of repeating, e.g., "write data input/read data output". This is because the logic correction circuit 9 inverts the output logic to the read data line PRD3 corresponding to the parity bit.

For a correct code word, i.e., reception word given from the write data line PWD3 corresponding to the parity bit, the logic correction circuit 9 inverts the input logic in advance and writes it in the memory cell 1. Accordingly, the reception word given from the write data line PWD3 corresponding to the parity bit and written in the memory cell 1 coincides with the code word read out from the memory cell 1 and output to the read data line PRD3 corresponding to the parity bit.

In this way, the logic correction circuit 9 can also solve the problem that a correct code word is generated from, e.g., externally supplied write data.

As described above, according to the semiconductor integrated circuit device of the first embodiment, the logic correction circuit 9 rewrites, to a correct code word, a code word which becomes a wrong code word in reading out data which depends not on, e.g., externally supplied write data but only on the state of the memory cells 1, i.e., reading out data from the memory cells 1 in the initial state. Hence, error correction can properly be executed in reading out data from the memory cells 1 in the initial state.

In addition, the logic correction circuit 9 inverts a reception word given from the write data line PWD and writes it in the memory cell 1. Hence, error correction can properly be executed not only in reading out data from the memory cells 1 in the initial state but also during the normal operation of repeating, e.g., "write data input/read data output".

Figure 5:
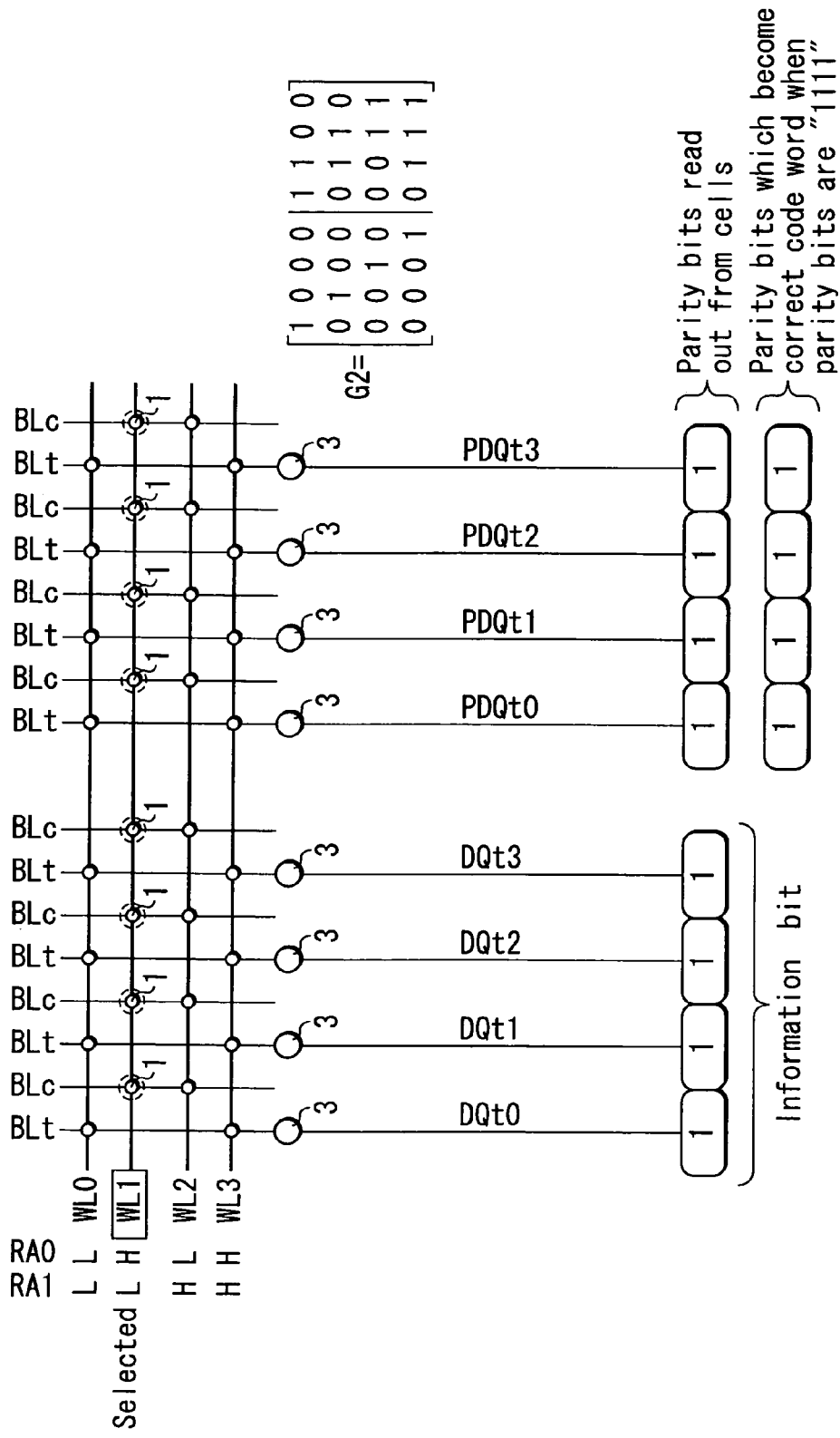
FIG. 5 is a circuit diagram showing a semiconductor integrated circuit device according to a reference example of the first embodiment of the present invention.

FIG. 5 is a circuit diagram showing a semiconductor integrated circuit device according to a reference example of the first embodiment of the present invention. In the reference example shown in FIG. 5, when an appropriate generator matrix G is selected, no error correction occurs. A generator matrix G2 in the reference example is given by $$G2 = \begin{bmatrix} 1 & 0 & 0 & 0 & | & 1 & 1 & 0 & 1 \\ 0 & 1 & 0 & 0 & | & 0 & 1 & 1 & 0 \\ 0 & 0 & 1 & 0 & | & 0 & 0 & 1 & 1 \\ 0 & 0 & 0 & 1 & | & 0 & 1 & 1 & 1 \end{bmatrix} \quad (2)$$

In the device shown in FIG. 5, when data is read out from the memory cells 1 in the initial state, for example, the information bits may be "1111", and the parity bits may also be "1111". However, in the generator matrix G2 represented by equation (2), when the information bits are "1111", the correct code word of parity bits is "1111". Hence, no error correction occurs.

However, some semiconductor integrated circuit devices cannot select the appropriate generator matrix represented by equation (2) because of, e.g., limitations on circuit design. The first embodiment is especially effective when, e.g., the appropriate generator matrix represented by equation (2) cannot be selected.

SECOND EMBODIMENT

Figure 6:
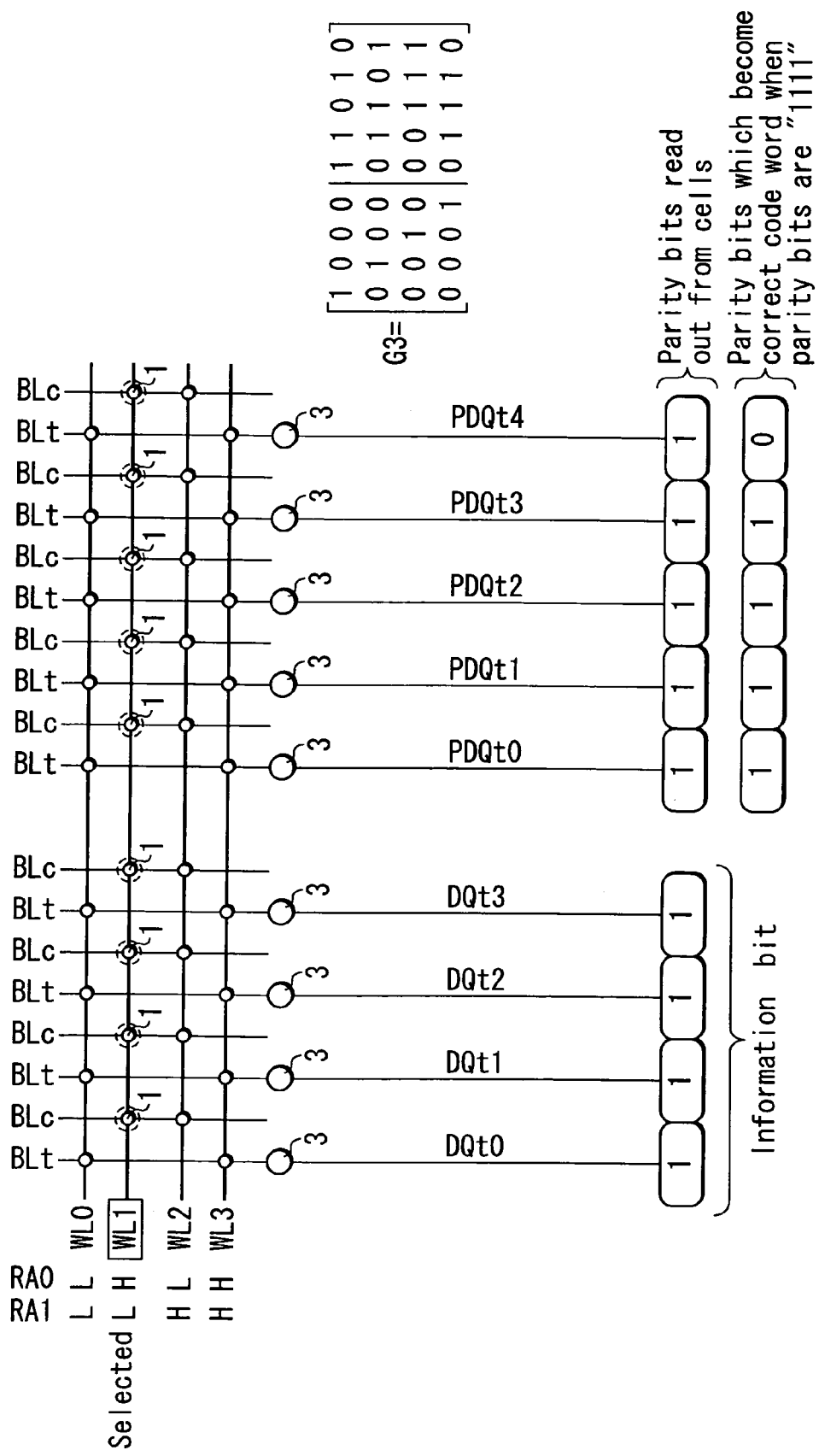
FIG. 6 is a circuit diagram showing an example of the connection relationship between memory cells and DQ lines in a semiconductor integrated circuit device according to the second embodiment of the present invention.

FIG. 6 is a circuit diagram showing an example of the connection relationship between memory cells and DQ lines in a semiconductor integrated circuit device according to the second embodiment of the present invention.

As shown in FIG. 6, the memory cell layout in the device according to the second embodiment is the same as in the device of the first embodiment. The second embodiment is different from the first embodiment particularly in that an extended Hamming code is used. When an extended Hamming code is used, one parity bit is added. In this embodiment, a DQ line PDQt4 corresponding to the parity bit is added, unlike the first embodiment.

The extended Hamming code used in this example is a (9,4,4)-extended Hamming code. The (9,4,4)-extended Hamming code is obtained by reducing a (16,11,4)-extended Hamming code. A generator matrix G3 is given by $$G3 = \begin{bmatrix} 1 & 0 & 0 & 0 & | & 1 & 1 & 0 & 1 & 0 \\ 0 & 1 & 0 & 0 & | & 0 & 1 & 1 & 0 & 1 \\ 0 & 0 & 1 & 0 & | & 0 & 0 & 1 & 1 & 1 \\ 0 & 0 & 0 & 1 & | & 0 & 1 & 1 & 1 & 0 \end{bmatrix} \quad (3)$$

In the device shown in FIG. 6, when information bits are "1111", and parity bits are "11111", the code word is wrong. For this reason, a rewrite by the error correcting function occurs. When the generator matrix G3 represented by equation (3) is used, the correct code word for information bits "1111" is "11110".

FIG. 7 is a view for explaining a problem in use of an extended Hamming code.

As shown in FIG. 7, an extended Hamming code is created by adding one parity bit to a Hamming code. In this example, the generator matrix G3 represented by equation (3) is used as a generator matrix. The parity of a row component is even, as indicated by a broken line frame A. Under such a limitation, no code can be created in which when information bits are "all 1s", the parities of the column components of the parity bits are "all 1s (odd)", as indicated by a broken line frame B. In this example, the parity of the fifth column is even. FIG. 8 is a view for explaining another problem in use of an extended Hamming code. Even in the example shown in FIG. 8, the (9,4,4)-extended Hamming code is used. A generator matrix G4 is given by $$G4 = \begin{bmatrix} 1 & 0 & 0 & 0 & | & 1 & 0 & 1 & 1 & 0 \\ 0 & 1 & 0 & 0 & | & 0 & 1 & 0 & 1 & 1 \\ 0 & 0 & 1 & 0 & | & 1 & 1 & 0 & 0 & 1 \\ 0 & 0 & 0 & 1 & | & 1 & 1 & 1 & 0 & 0 \end{bmatrix} \quad (4)$$

As shown in FIG. 8, when the generator matrix G4 is used, the parities of the row components are even again, as indicted by a broken line frame A. In this example, the parities of the third, fourth, and fifth columns are even.

As shown in FIGS. 7 and 8, when an extended Hamming code is used, no generator matrix can be created in which when information bits are "all 1s", the correct code word bits of parity bits are also "all 1s". An error correcting code is generally selected on the basis of the balance of various conditions such as the operation speed of the circuit, the circuit area, and the correction capability, and therefore has complex limitations. There is also a certain situation where the extended Hamming code shown in FIG. 7 or 8 must be selected.

Figure 9:
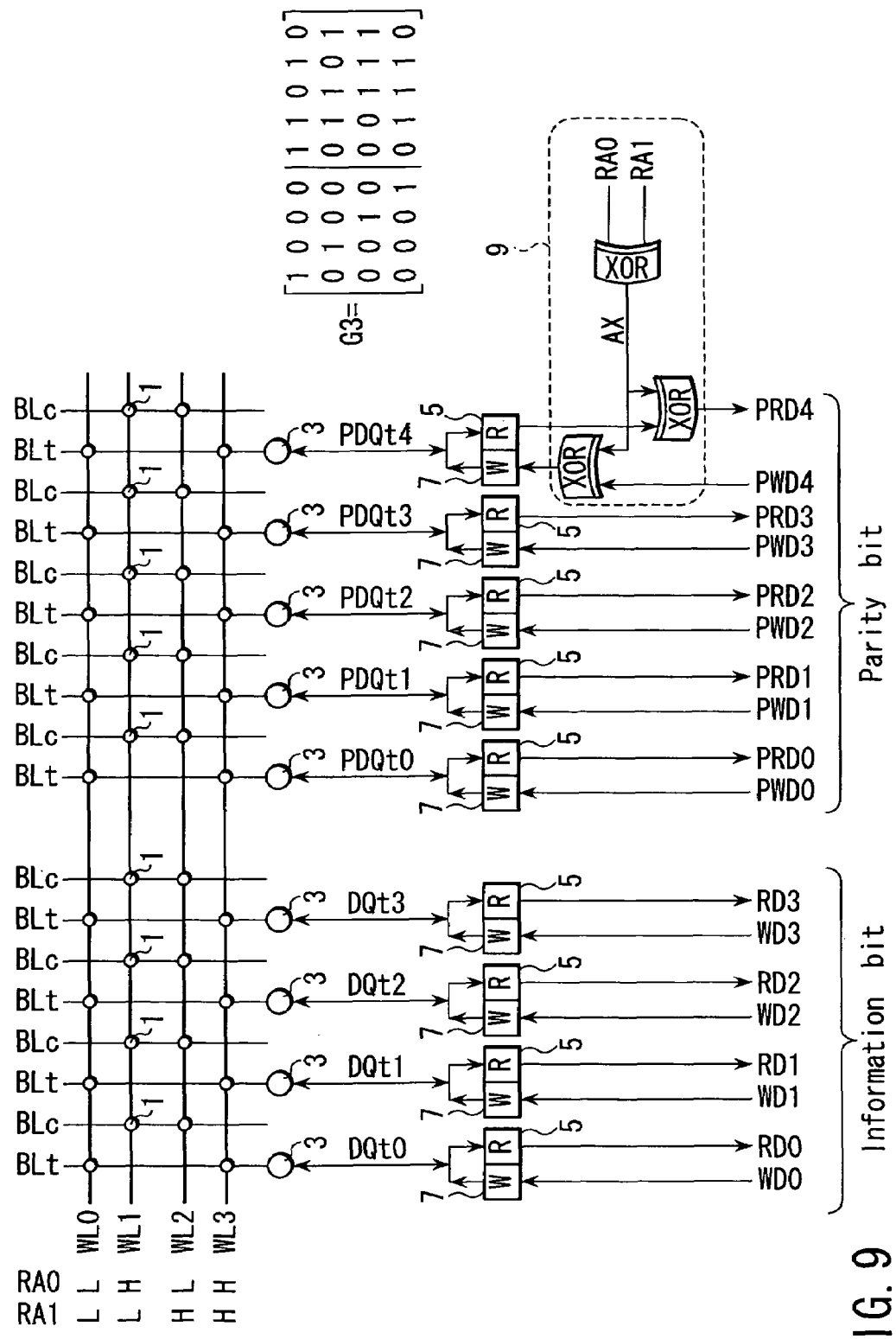
FIG. 9 is a circuit diagram showing the first example of the connection relationship between the DQ lines, read data lines, and write data lines in the semiconductor integrated circuit device according to the second embodiment of the present invention.

FIG. 9 is a circuit diagram showing the first example of the connection relationship between the DQ lines, read data lines, and write data lines in the semiconductor integrated circuit device according to the second embodiment of the present invention.

In the example shown in FIG. 9, the generator matrix G3 represented by equation (3) is used. In this example, a logic correction circuit 9 is inserted between a read data line buffer (R) 5 and a read data line PRD4 corresponding to a parity bit and between a write data line buffer (W) 7 and a write data line PWD4 corresponding to the parity bit.

When row addresses RA0 and RA1 "do not coincide", the logic correction circuit 9 inverts the output logic to the read data line PRD4 corresponding to the parity bit. The logic correction circuit 9 also inverts the input logic to the write data line PWD4 corresponding to the parity bit and inputs it to the write data line buffer 7.

As described above, even in the second embodiment, when parity bits are read out from, of the memory cells in the initial state, the memory cells 1 connected to the bit lines BLc, the logic correction circuit 9 rewrites the code word "11111" to a correct code word "11110", as in the first embodiment. Even when data is read out from the memory cells in the initial state, error correction can properly be executed. In addition, error correction can properly be executed even during a normal operation of repeating, e.g., write data input and read data output.

Figure 10:
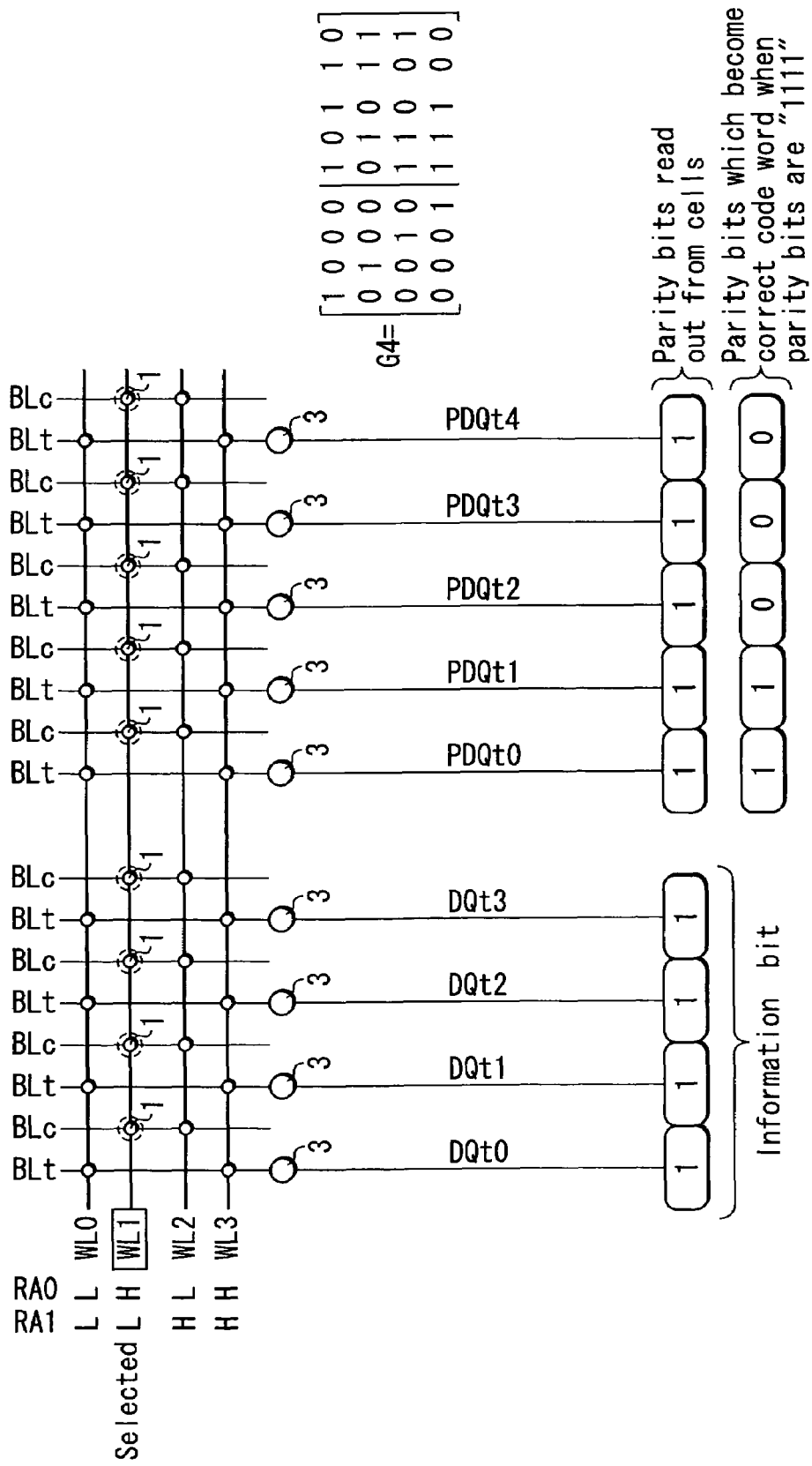
FIG. 10 is a view showing read data transmitted to DQ lines DQt when a word line WL1 is selected by using a generator matrix G4.

FIG. 10 is a view showing read data transmitted to DQ lines DQt when a word line WL1 is selected by using the generator matrix G4.

In the example shown in FIG. 10, the (9,4,4)-extended Hamming code is used. As a generator matrix, the generator matrix G4 represented by equation (4) is used.

Even in this example, when information bits are "1111", and parity bits are "11111", the code word is wrong, as in the example shown in FIG. 6. When the generator matrix G4 represented by equation (4) is used, the correct code word for information bits "1111" is "11000".

Figure 11:
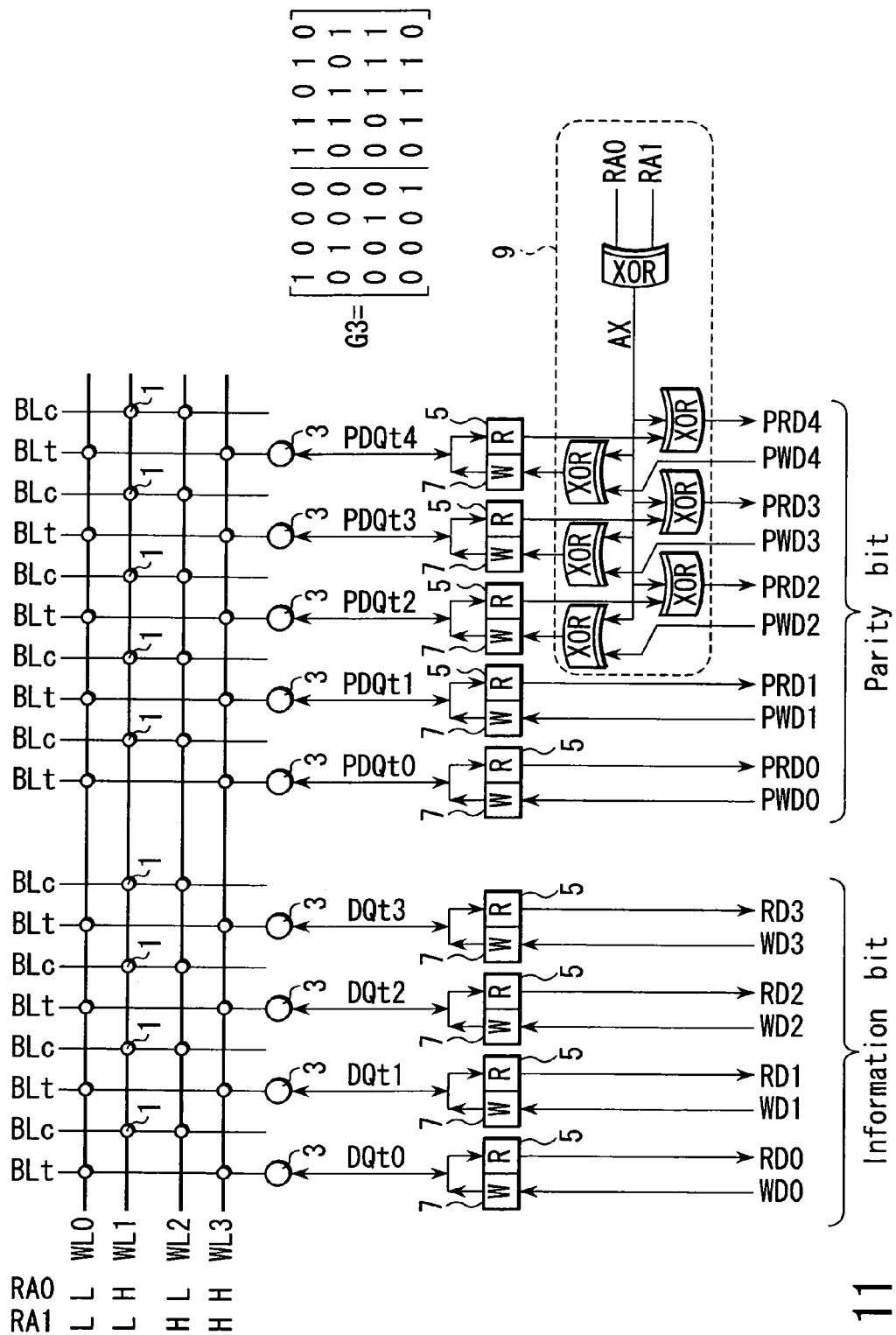
FIG. 11 is a circuit diagram showing the second example of the connection relationship between the DQ lines, the read data lines, and the write data lines in the semiconductor integrated circuit device according to the second embodiment of the present invention.

FIG. 11 is a circuit diagram showing the second example of the connection relationship between the DQ lines, the read data lines, and the write data lines in the semiconductor integrated circuit device according to the second embodiment of the present invention.

In the example shown in FIG. 11, the generator matrix G4 represented by equation (4) is used. The example shown in FIG. 11 is different from that shown in FIG. 9 in that when the row addresses RA0 and RA1 "do not coincide", the logic correction circuit 9 inverts the output logics to read data lines PRD2, PRD3, and PRD4 corresponding to parity bits. In addition, the logic correction circuit 9 inverts the output logics from write data lines PWD2, PWD3, and PWD4 corresponding to the parity bits and inputs them to the write data line buffer 7.

Even in this example, when parity bits are read out from, of the memory cells in the initial state, the memory cells 1 connected to the bit lines BLc, the logic correction circuit 9 rewrites the code word "11111" to a correct code word "11000". In addition, error correction can properly be executed even during the normal operation of repeating, e.g., write data input and read data output.

THIRD EMBODIMENT

Figure 12:
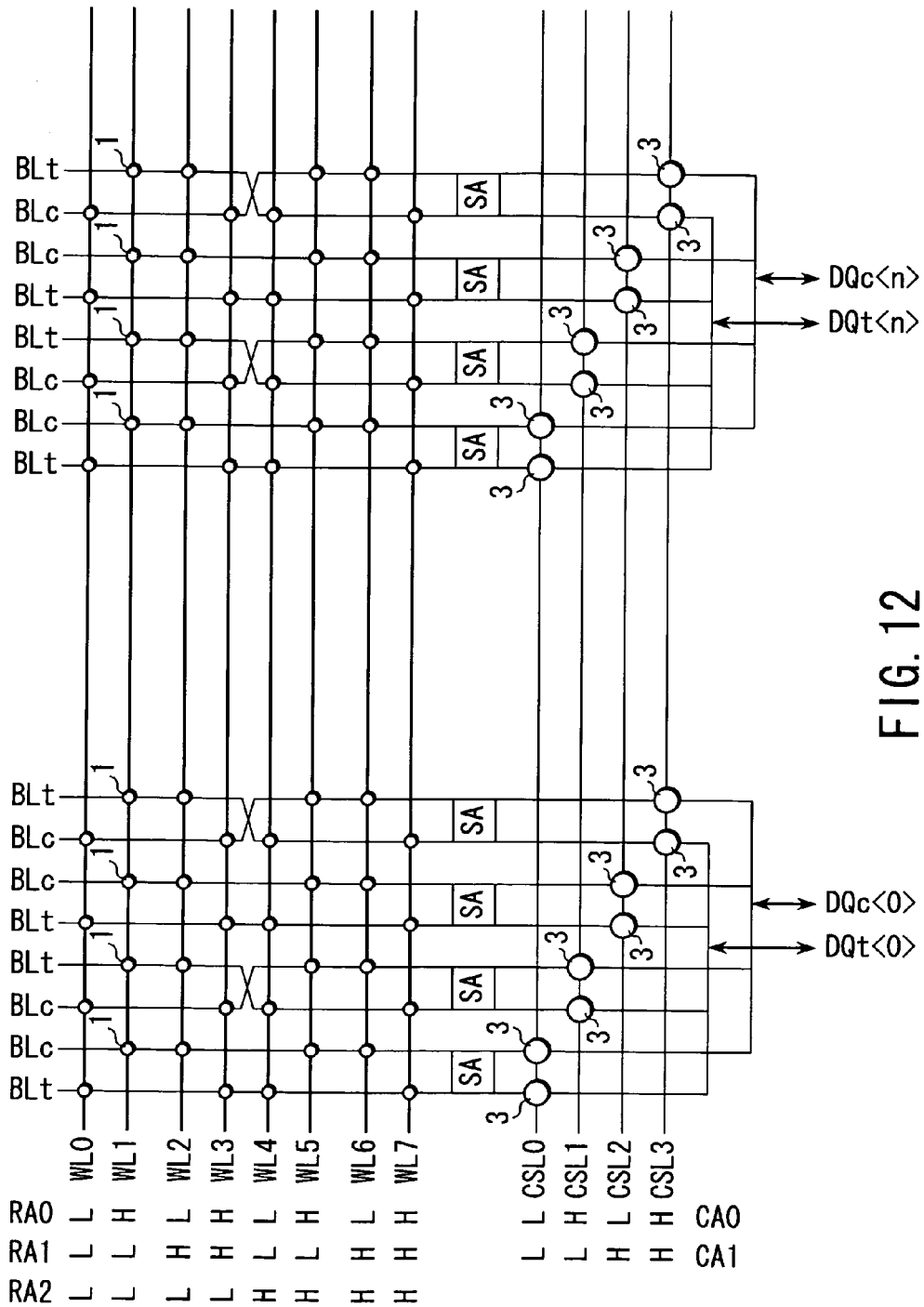
FIG. 12 is a circuit diagram showing an example of the connection relationship between memory cells and DQ lines in a semiconductor integrated circuit device according to the third embodiment of the present invention.
Figure 13:
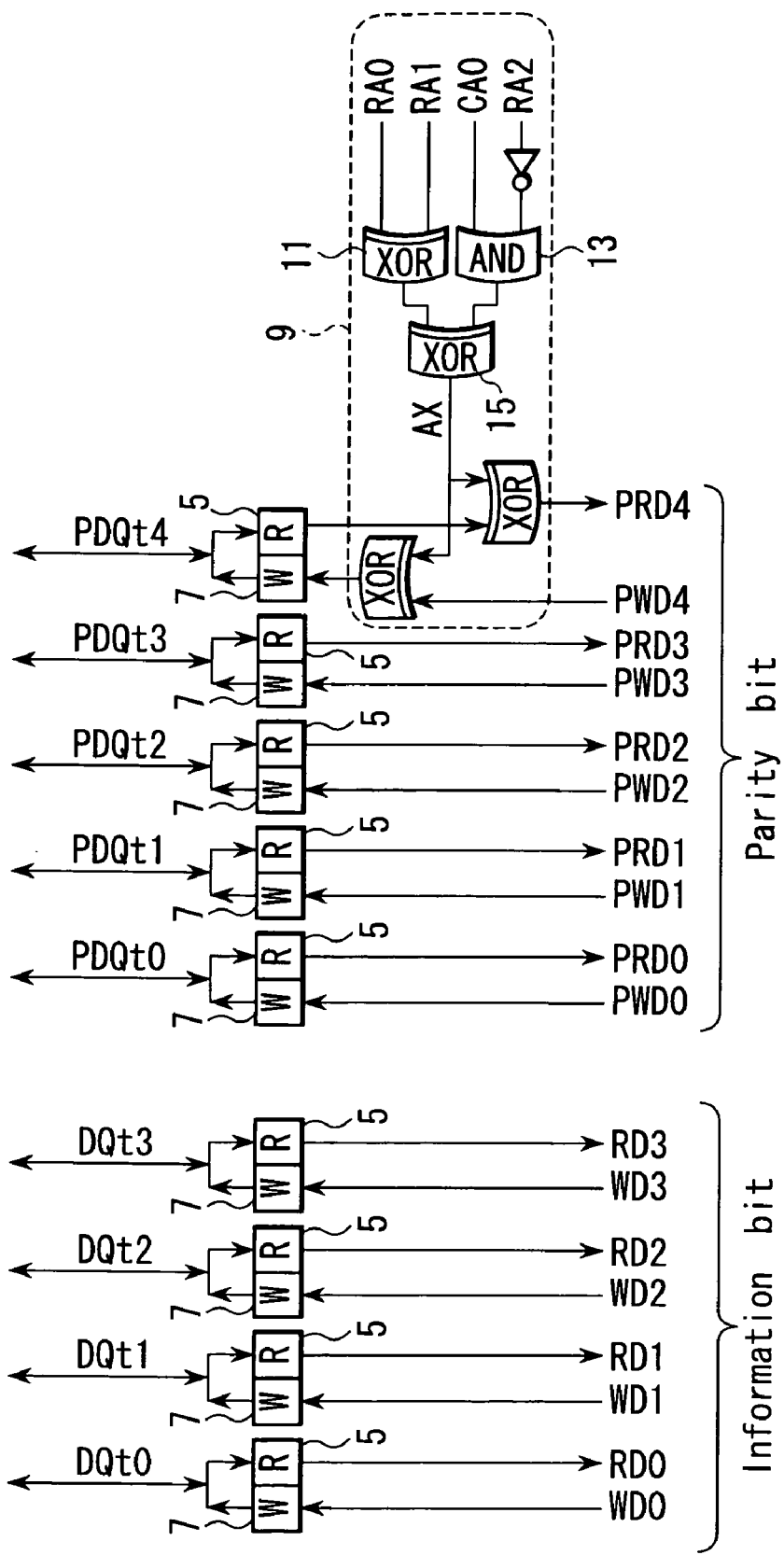
FIG. 13 is a circuit diagram showing an example of the connection relationship between the DQ lines, read data lines, and write data lines in the semiconductor integrated circuit device according to the third embodiment of the present invention.

FIG. 12 is a circuit diagram showing an example of the connection relationship between memory cells and DQ lines in a semiconductor integrated circuit device according to the third embodiment of the present invention. FIG. 13 is a circuit diagram showing an example of the connection relationship between the DQ lines, read data lines, and write data lines in the semiconductor integrated circuit device according to the third embodiment of the present invention. In the third embodiment, a generator matrix G3 represented by equation (3) is used.

As shown in FIGS. 12 and 13, the third embodiment is different from the second embodiment in the layout of bit lines BL. The bit lines BL of the semiconductor integrated circuit device according to the third embodiment are twisted bit lines.

To cope with the twisted bit lines, a logic correction circuit 9 according to the third embodiment inverts the output logic to a read data line PRD4 corresponding to a parity bit on the basis of the logic relationship of row addresses RA<0:2> and the logic relationship of column addresses CA<0:1>. The logic correction circuit 9 also inverts the input logic from a write data line PWD4 corresponding to the parity bit and inputs it to a write data line buffer 7.

Even in the third embodiment, the generator matrix G3 represented by equation (3) is used. For this reason, when a word line which selects memory cells 1 connected to bit lines BLc is selected, parity bits indicates a wrong code word.

In the third embodiment, when a row address RA2 is "H", word lines which select the memory cells 1 connected to the bit lines BLc are "WL5" and "WL6". However, when the row address RA2 is "L", the word lines are "WL0" and "WL3" or "WL1" and "WL2" because the bit lines BL are twisted bit lines. The word lines to be selected are determined on the basis of, e.g., which column select lines are selected from column select lines CSL<0:3>.

In the example shown in FIG. 12, when the bit lines BL are selected by the column select lines CSL1 and CSL3, word lines which select the memory cells 1 connected to the bit lines BLc are "WL0" and "WL3". When the bit lines BL are selected by the column select lines CSL0 and CSL2, word lines which select the memory cells 1 connected to the bit lines BLc are "WL1" and "WL2".

To enable the logic correction circuit 9 to cope with the twisted bit lines, for example, that the word lines which select the memory cells 1 connected to the bit lines BLc are switched is detected. The operation of inverting the output logic to the read data line PRD4 corresponding to the parity bit and the operation of inverting the input logic from the write data line PWD4 corresponding to the parity bit and inputting it to the write data line buffer 7 is reversed in accordance with "switching of word lines" (this operation will be referred to as reverse of rewrite operation hereinafter).

Figure 14:
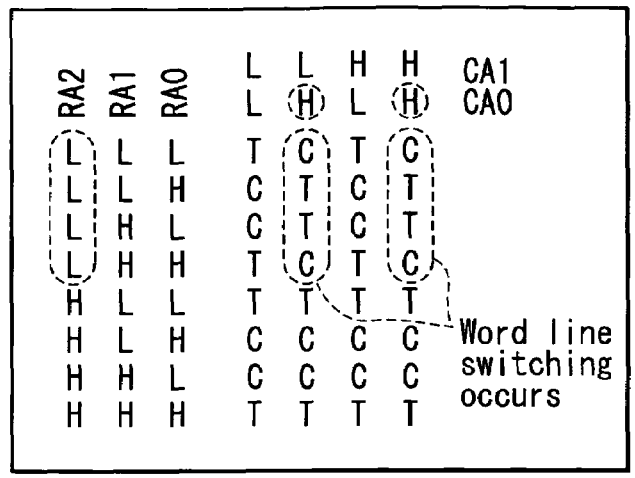
FIG. 14 is a view showing an example of data scrambling of the semiconductor integrated circuit device according to the third embodiment of the present invention.
Figure 15:
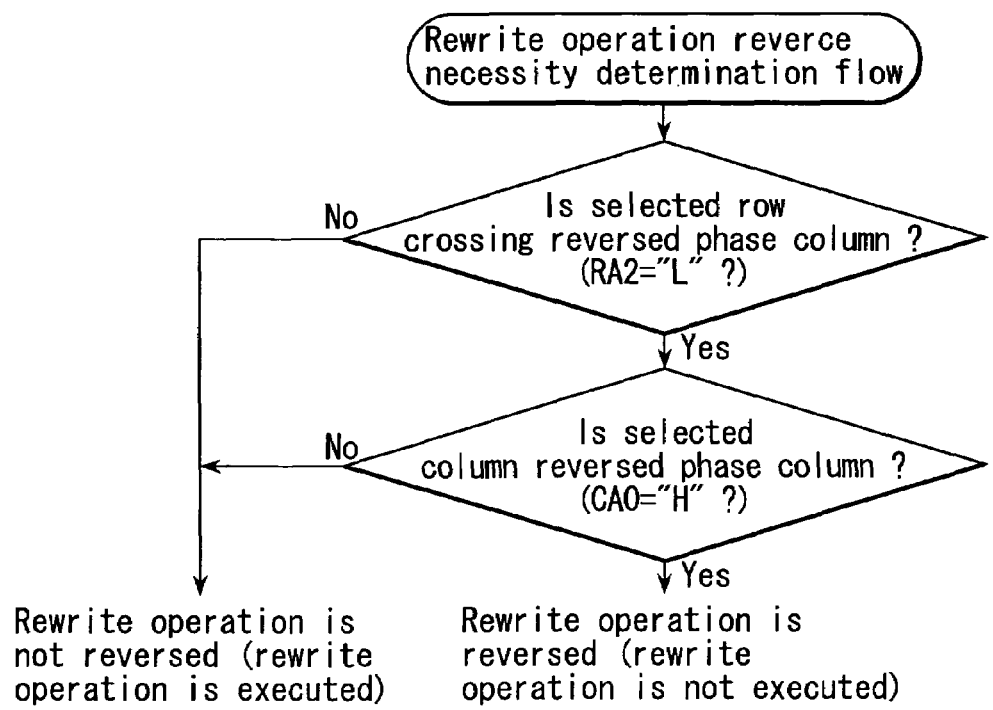
FIG. 15 is a flow chart showing an example of the rewrite operation reverse necessity determination flow of the semiconductor integrated circuit device according to the third embodiment of the present invention.

To detect "switching of word lines", for example, the logic relationship of row addresses RA<0:2> and the logic relationship of column addresses CA<0:1> are referred to. In the example shown in FIG. 12, "switching of word lines" occurs when the logics of the row addresses select a row (word line) which crosses a column (to be referred to as a reversed phase column hereinafter) in which the connection state of the memory cells to the bit lines BLt and BLc is in the reversed phase, and the logics of the column addresses select the reversed phase column. In this example, it occurs when the row address RA2 is "L" (first condition), and a column address CA0 is "H" (second condition). FIG. 14 shows an example of data scrambling of the semiconductor integrated circuit device according to the third embodiment. FIG. 15 shows an example of the rewrite operation reverse necessity determination flow.

As shown in FIGS. 14 and 15, "switching of word lines" occurs when the first condition (RA2="L") and second condition (CA0="H") are simultaneously satisfied. As a detailed circuit example, the logic correction circuit 9 of the third embodiment has a function of detecting whether the logics of the row address RA2 and column address CA0 are "H" or "L" in addition to the function of detecting whether the row addresses RA0 and RA1 "do not coincide" or "coincide".

For example, as shown in FIG. 13, in the logic correction circuit 9 according to the third embodiment, the function of detecting whether the row addresses RA0 and RA1 "do not coincide" or "coincide" is implemented by, e.g., an exclusive OR circuit (XOR) 11. The function of detecting whether the logics of the row address RA2 and column address CA0 are "H" or "L" is implemented by, e.g., an AND circuit (AND) 13. A detailed example of the operation will be described below.

(1. Detection of Row Addresses RA0 and RA1)

The logic correction circuit 9 detects, e.g., whether the row addresses RA0 and RA1 "do not coincide" or "coincide".

When the row addresses "do not coincide", the output from the XOR 11 is "H" level. When the row addresses "coincide", the output from the XOR 11 is "L" level. The output from the XOR 11 is input to the first input of an XOR 15. The XOR 15 is a circuit which determines whether the rewrite operation should be executed.

(2. Detection of Row Address RA2)

The logic correction circuit 9 also detects, e.g., whether the logic of the row address RA2 is "H" or "L".

(RA2=H)

When the row address RA2 is "H", "switching of word lines" does not occur.

When the row address RA2 is "H", the logic is inverted by an inverter 17 and input to the first input of the AND 13 as "L". When the first input of the AND 13 is "L", the output from it is fixed to "L" independently of the logic of the second input (column address CA0). The "L" output from the AND 13 is input to the second input of the XOR 15.

More specifically, when the row address RA2 is "H", "switching of word lines" does not occur. For this reason, the XOR 15 determines whether the rewrite operation should be executed, on the basis of only the output from the XOR 11, i.e., the result of detecting whether the row addresses RA0 and RA1 "do not coincide" or "coincide".

When the row addresses RA0 and RA1 "do not coincide", the first input of the XOR 15 is "H", and the second input is "L". Hence, AX=H, and the rewrite operation is executed. The selected word line is "WL5" or "WL6".

Conversely, when the row addresses RA0 and RA1 "coincide", the first input of the XOR 15 is "L", and the second input is "L". Hence, AX=L, and the rewrite operation is not executed. The selected word line is "WL4" or "WL7".

(RA2=L)

When the row address RA2 is "L", "switching of word lines" occurs in accordance with the column address CA0.

When the row address RA2 is "L", the logic is inverted by the inverter 17 and input to the first input of the AND 13 as "H". When the first input of the AND 13 is "H", the output from it becomes the logic of the second input (column address CA0).

(3. Column Address CA0 Detection Operation)

When the row address RA2 is "L", "switching of word lines" may occur. The logic correction circuit 9 detects, e.g., whether the logic of the column address CA0 is "H" or "L".

The XOR 15 determines whether the rewrite operation should be executed, on the basis of the output from the XOR 11, i.e., the result of detecting whether the row addresses RA0 and RA1 "do not coincide" or "coincide" and the detection result of the logic of the column address CA0.

(CA0=L)

When the column address CA0 is "L", "switching of word lines" does not occur.

When the row addresses RA0 and RA1 "do not coincide", the first input of the XOR 15 is "H", and the second input is "L". Hence, the rewrite operation is executed. The selected word line is "WL1" or "WL2". The selected column select line is "CSL0" or "CSL2".

Conversely, when the row addresses RA0 and RA1 "coincide", the first input of the XOR 15 is "L", and the second input is "L". Hence, the rewrite operation is not executed. The selected word line is "WL0" or "WL3". The selected column select line is "CSL0" or "CSL2".

(CA0=H)

When the column address CA0 is "H", "switching of word lines" occurs.

When the row addresses RA0 and RA1 "do not coincide", the first input of the XOR 15 is "H", and the second input is "H". The rewrite operation is reversed. The rewrite operation is not executed. The selected word line is "WL1" or "WL2". The selected column select line is "CSL1" or "CSL3".

Conversely, when the row addresses RA0 and RA1 "coincide", the first input of the XOR 15 is "L", and the second input is "H". The rewrite operation is reversed. The rewrite operation is executed. The selected word line is "WL0" or "WL3". The selected column select line is "CSL1" or "CSL3".

Even in the third embodiment, when parity bits are read out from, of the memory cells in the initial state, the memory cells 1 connected to the bit lines BLc, the logic correction circuit 9 rewrites the code word "11111" to a correct code word "11110".

In addition, in the third embodiment, "whether the selected row crosses the reversed phase column" and "whether the selected column is the reversed phase column" are determined. If both conditions are satisfied, the rewrite operation is reversed. Hence, the logic correction circuit 9 can cope with even twisted bit lines.

FOURTH EMBODIMENT

Figure 16:
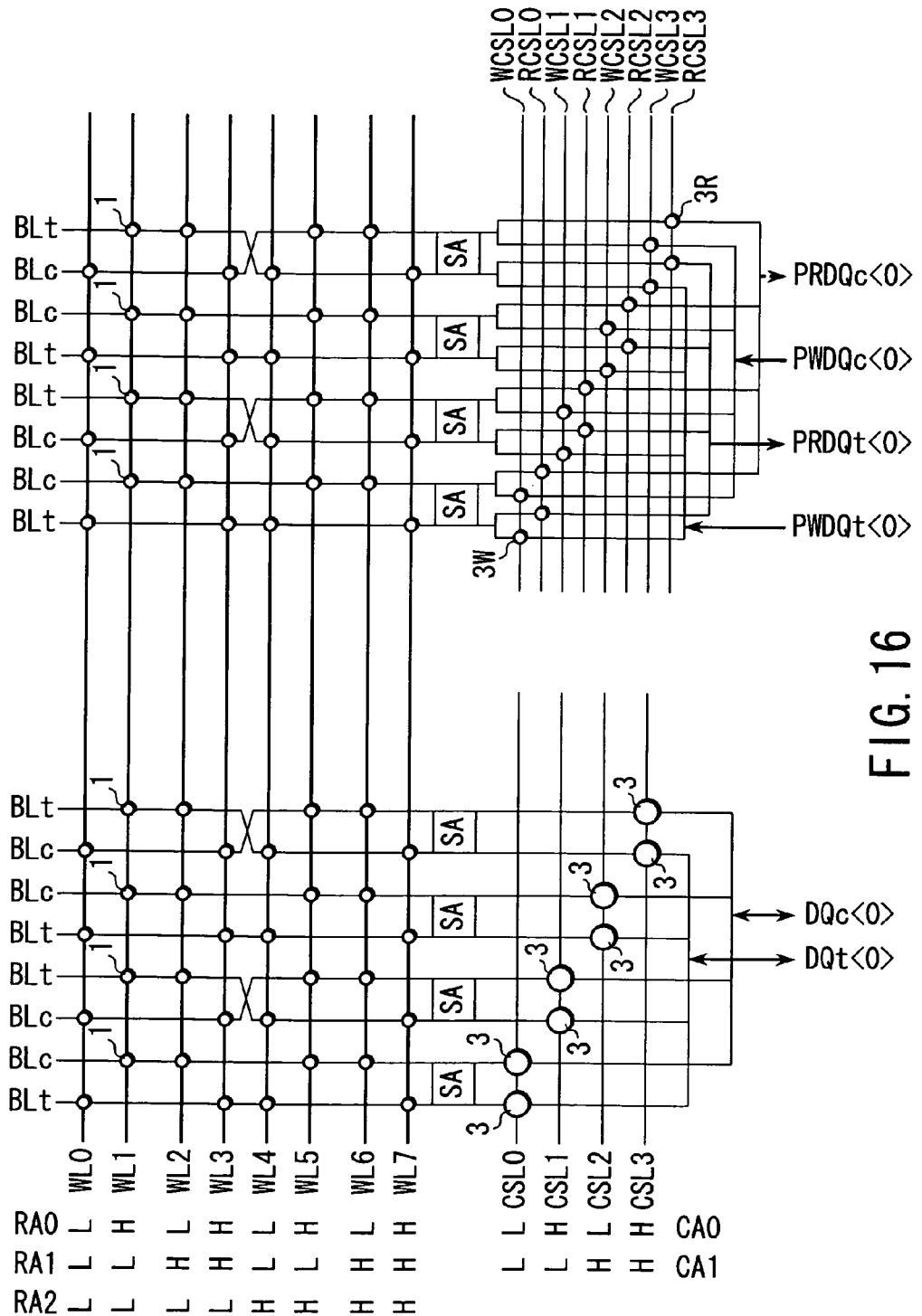
FIG. 16 is a circuit diagram showing an example of the connection relationship between memory cells and DQ lines in a semiconductor integrated circuit device according to the fourth embodiment of the present invention.
Figure 17:
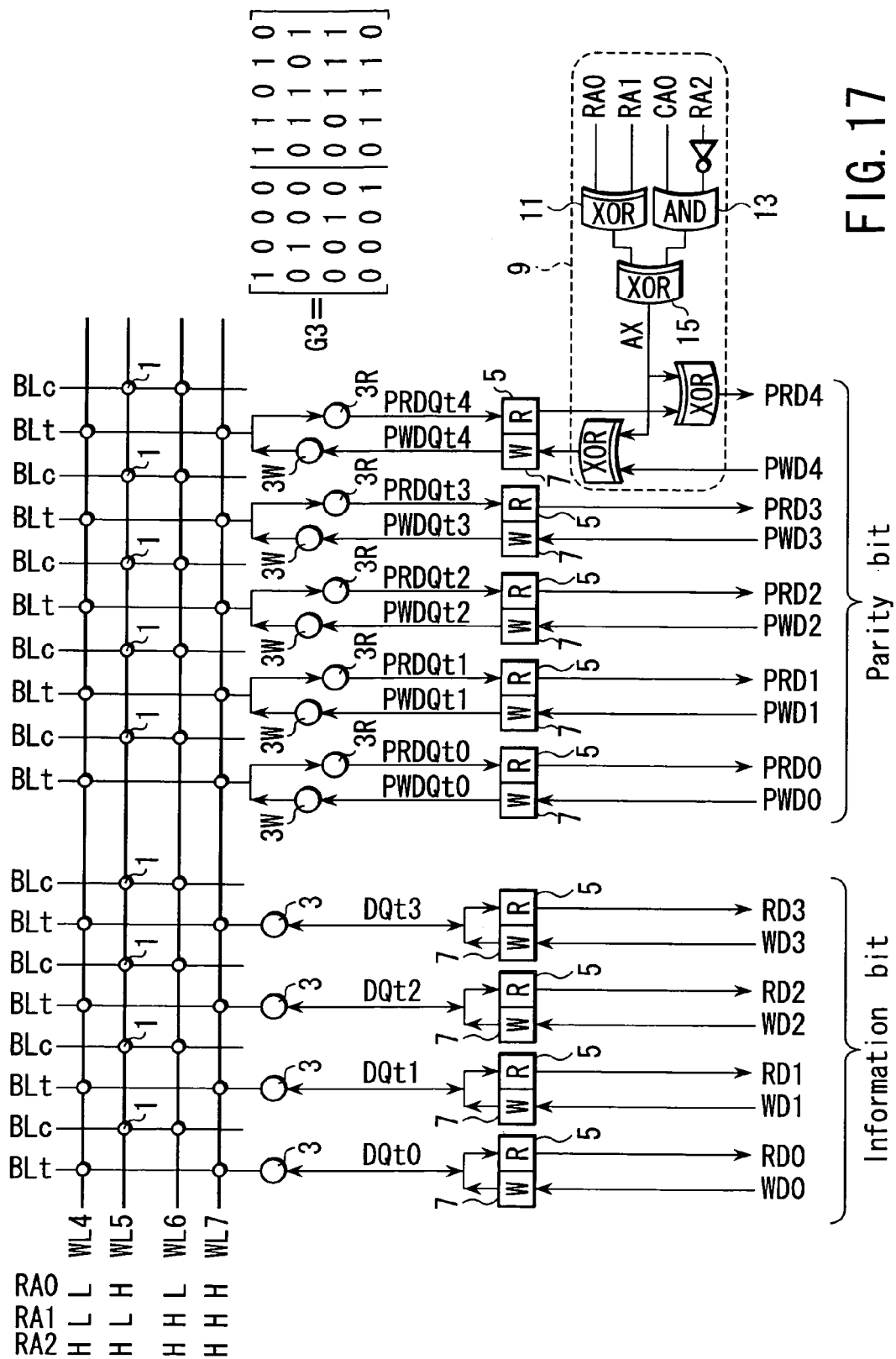
FIG. 17 is a circuit diagram showing an example of the connection relationship between the DQ lines, read data lines, and write data lines in the semiconductor integrated circuit device according to the fourth embodiment of the present invention.

FIG. 16 is a circuit diagram showing an example of the connection relationship between memory cells and DQ lines in a semiconductor integrated circuit device according to the fourth embodiment of the present invention. FIG. 17 is a circuit diagram-showing an example of the connection relationship between the DQ lines, read data lines, and write data lines in the semiconductor integrated circuit device according to the fourth embodiment of the present invention. The fourth embodiment uses a generator matrix G3 represented by equation (3).

As shown in FIGS. 16 and 17, the semiconductor integrated circuit device according to the fourth embodiment is different from that of the third embodiment in that read and write data lines DQ corresponding to parity bits have dual ports. The read and write data lines DQ with dual ports include pairs of read DQ lines PRDQt and PRDQc and pairs of write DQ lines PWDQt and PWDQc. A pair of DQ lines PRDQt and PRDQc are selected by a read column switch 3R. The selected pairs of DQ lines PRDQt and PRDQc are connected to a read data line buffer 5. A pair of DQ lines PWDQt and PWDQc are selected by a write column switch 3W. The selected pair of DQ lines PWDQt and PWDQc are connected to a write data line buffer 7. The column switch 3R is turned on/off in accordance with the potential of a read column select line RCSL. The column switch 3W is turned on/off in accordance with the potential of a write column select line WCSL.

The remaining components are the same as in, e.g., the semiconductor integrated circuit device according to the third embodiment, and a repetitive description thereof will be omitted.

As described above, the semiconductor integrated circuit device according to the embodiment of the present invention can also be applied to a dual-port-type semiconductor integrated circuit device.

FIFTH EMBODIMENT

Figure 18:
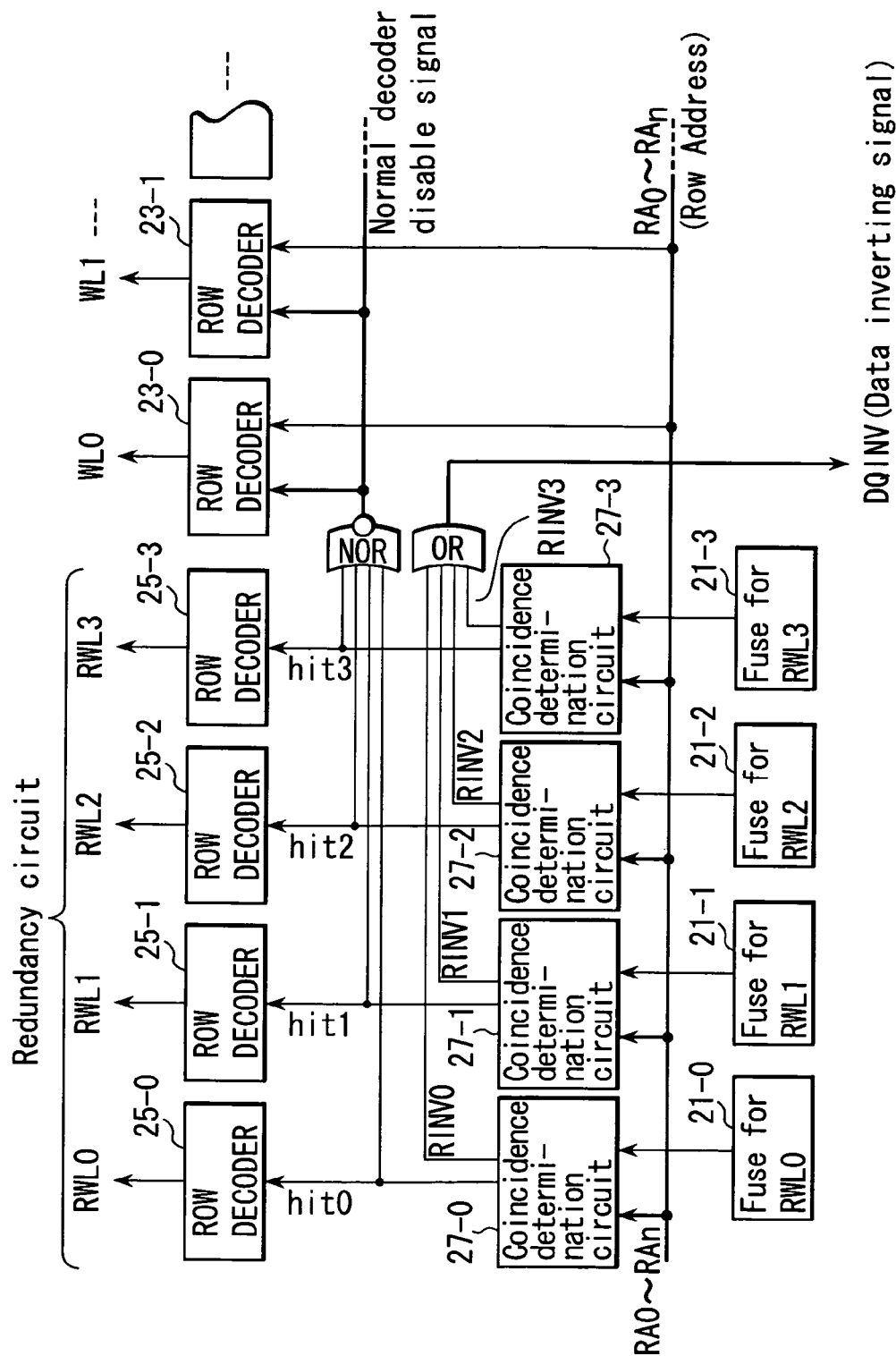
FIG. 18 is a circuit diagram showing an example of the row control circuit (row decoder) of a semiconductor integrated circuit device according to the fifth embodiment of the present invention.

FIG. 18 is a circuit diagram showing an example of the row control circuit (row decoder) of a semiconductor integrated circuit device according to the fifth embodiment of the present invention. The semiconductor integrated circuit device according to the fifth embodiment is a semiconductor integrated circuit device with a redundancy circuit.

When no redundant word lines RWL (RW10 to RWL3) are used, and normal word lines WL (WL0, WL1, . . . ) are used, row addresses RA (RA0 to RAn) do not coincide with any piece of fuse information (substitute information) programmed in fuses 21 (21-0 to 21-3). In this case, the potential of a signal (normal decoder disable signal) is, e.g., "L" level. The normal decoder disable signal instructs whether normal row decoders 23 (23-0, 23-1, . . . ) are to be disabled. In this example, when the potential of the normal decoder disable signal is "L" level, the normal row decoder 23 is enabled to decode the row address RA and select one of normal word lines WL0, WL1, . . . .

When the redundant word lines RWL are used, the row address RA hits (coincides with) one of the pieces of fuse information programmed in the fuses 21. When the row address RA hits fuse information, the potential of the normal decoder disable signal changes to "H" level to disable the normal row decoders 23. Instead, one of redundant row decoders 25 (25-0 to 25-3) is enabled. The enabled redundant row decoder 25 decodes the row address RA to select the redundant word line RWL. A detailed example of the operation will be described below.

For example, when the row address RA is "RA0=H, and RA1=L", the normal word line WL1 is selected. If a defective memory cell is connected to the normal word line WL1, it is replaced with one of redundant word lines RWL1 to RWL3. For example, assume that the normal word line WL1 is replaced with the redundant word line RWL2. In this case, of the fuses 21, the RWL2 fuse 21-2 is, e.g., blow to program fuse information in the RWL2 fuse. The programmed fuse information is given to a coincidence determination circuit 27 (27-0 to 27-3). The coincidence determination circuit 27 determines whether the row address RA coincides with the fuse information by, e.g., comparing them.

In this embodiment, when the row address RA is "RA0=H, and RA1=L", the coincidence determination circuit 27-2 outputs a hit signal hit2 of "H" level. The remaining coincidence determination circuits 27-0, 27-1, and 27-3 output hit signals hit0, hit1, and hit3 of "L" level. When the hit signal hit2 changes to "H", the redundant row decoder 25-2 is enabled to select the redundant word line RWL2. Accordingly, the normal decoder disable signal changes to "H" level to disable, e.g., all the normal row decoders 23.

In the semiconductor integrated circuit device according to the fifth embodiment, in determining the coincidence between the row address RA and fuse information, it is determined whether the layout of memory cells connected to a normal word line WLi before replacement is the same as that of memory cells connected to a redundant word line RWLj after replacement. The layout of memory cells means "true" or "complement" of bit line pairs to which the memory cells are connected. The coincidence determination circuit 27 of this example outputs cell layout inverting signals RINV0 to RINV3 in accordance with whether the memory cell layout before replacement is the same as that after replacement. In this example, the cell layout inverting signals RINV0 to RINV3 take, e.g., the following values. In the following list, of the redundant word lines RWL- to RWL3, the replaced and selected redundant word line is described as "RWLj". A cell layout inverting signal corresponding to the redundant word line RWLj is described as "RINVj".

1. When the row address RA does not hit any one of the redundant word lines RWL, RINVj=L
2. When the row address RA hits RWL except the replaced and selected redundant word line RWLj, RINVj=L
3. When the row address RA hits the replaced and selected redundant word line RWLj, and the cell layout of RWLj is the same as that of the normal word line WL before replacement, RINVj=L
4. When the row address RA hits the replaced and selected redundant word line RWLj, and the cell layout of RWLj is reverse to that of the normal word line WL before replacement, RINVj=H The signals RINV0 to RINV3 are ORed to generate a signal DQINV. The signal DQINV instructs whether inversion of the output logic to the read data line PRD corresponding to a parity bit and inversion of the output logic from the write data line PWD are to be executed. The signal DQINV is input to a logic correction circuit 9.

Figure 19:
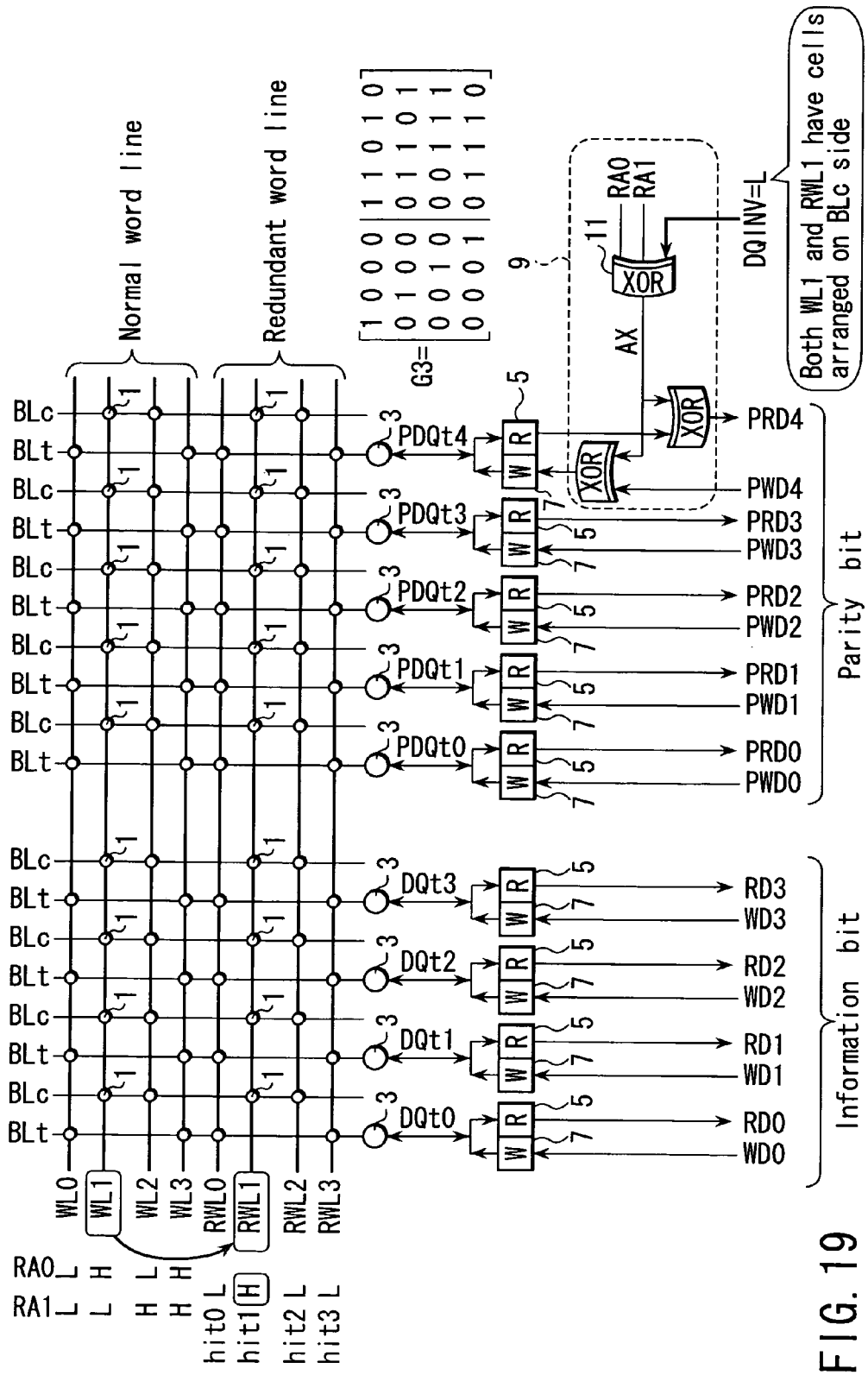
FIG. 19 is a circuit diagram showing an example of the connection relationship between DQ lines, read data lines, and write data lines in the semiconductor integrated circuit device according to the fifth embodiment of the present invention (in replacing RWL1)
Figure 20:
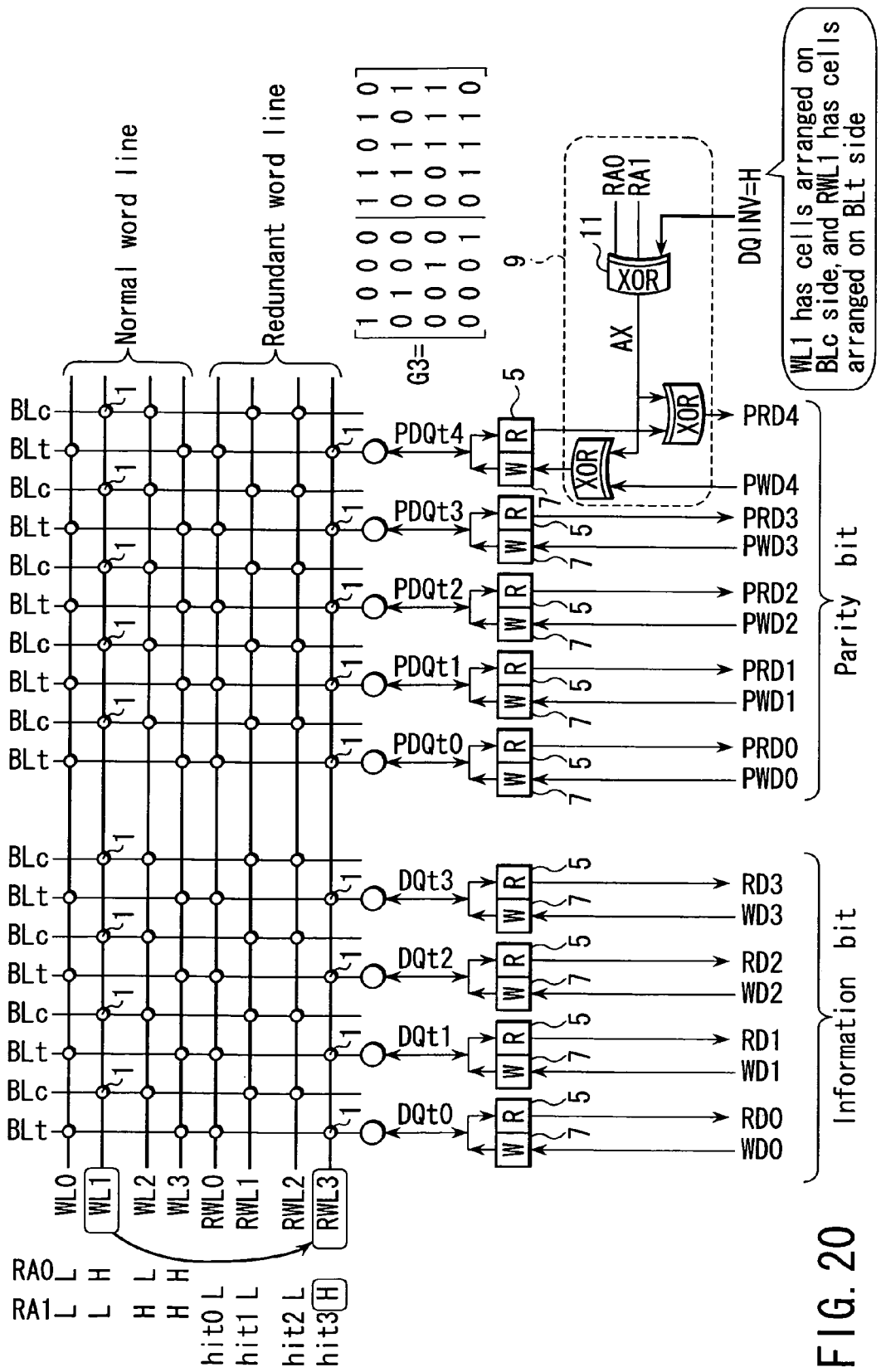
FIG. 20 is a circuit diagram showing an example of the connection relationship between the DQ lines, the read data lines, and the write data lines in the semiconductor integrated circuit device according to the fifth embodiment of the present invention (in replacing RWL3)

FIGS. 19 and 20 are circuit diagrams showing examples of the connection relationship between DQ lines, read data lines, and write data lines in the semiconductor integrated circuit device according to the fifth embodiment of the present invention. FIGS. 19 and 20 show the relationship between the normal word lines before replacement and redundant word lines after replacement and the relationship to the signal logic of the signal DQINV. The bit lines of the devices shown in FIGS. 19 and 20 are not twisted bit lines but normal bit lines. The generator matrix G3 represented by equation (3) is used.

FIG. 19 shows a case in which the word line WL1 is replaced with the redundant word line RWL1. Both memory cells 1 connected to the word line WL1 and those connected to the redundant word line RWL1 are connected to bit lines BLc. That is, the cell layout of the redundant word line RWL1 is the same as that of the normal word line WL1. In this example, when the row address RA hits the redundant word line RWL1, the potential of the signal DQINV is "L" level. The signal DQINV is input to an XOR 11 of the logic correction circuit 9.

Upon receiving the signal DQINV of "L" level, the XOR 11 determines the logic of an output AX in accordance with the logics of the row addresses RA0 and RA1. For example, when the row addresses RA0 and RA1 do not coincide, the XOR 11 sets the potential of the output AX to "H" level to execute inversion of the output logic to the read data line PRD4 and inversion of the output logic from the write data line PWD4. That is, the parity bit rewrite operation is executed in accordance with the same operation as that in selecting the normal word line.

FIG. 20 shows a case in which the word line WL1 is replaced with the redundant word line RWL3. The memory cells connected to the redundant word line RWL3 are connected to bit lines BLt. That is, the cell layout of the redundant word line RWL3 is reverse to that of the normal word line WL1. In this case, the potential of the signal DQINV is "H" level.

Figure 21:
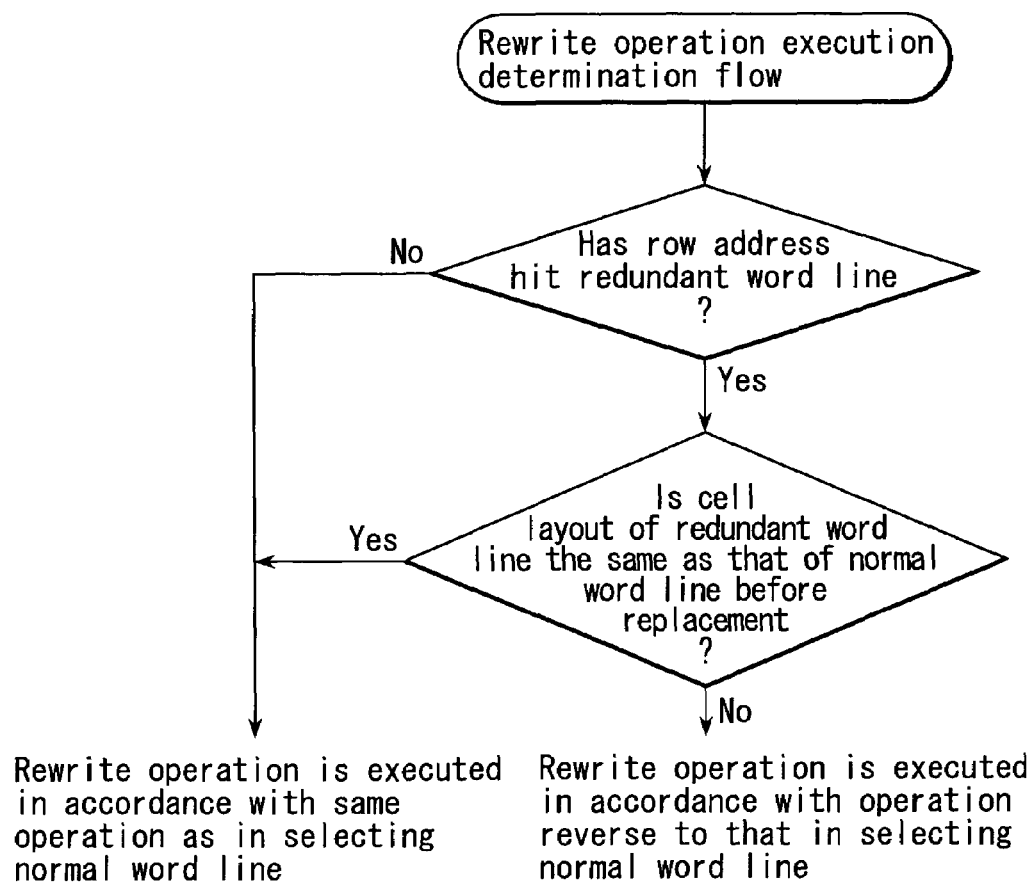
FIG. 21 is a flow chart showing an example of the rewrite operation execution determination flow of the semiconductor integrated circuit device according to the fifth embodiment of the present invention.

Upon receiving the signal DQINV of "H" level, the XOR 11 determines the logic of the output AX in accordance with the logics of the row addresses RA0 and RA1. The XOR 11 inverts the logic. For example, when the row addresses RA0 and RA1 do not coincide, the XOR 11 sets the potential of the output AX to "L" level and does not execute inversion of the output logic to the read data line PRD4 and inversion of the output logic from the write data line PWD4. That is, the parity bit rewrite operation is not executed. The parity bit rewrite operation is executed in accordance with an operation reverse to that in selecting a normal word line. FIG. 21 shows an example of the rewrite operation execution determination flow according to the fifth embodiment.

According to the fifth embodiment, as shown in FIG. 21, when redundant word lines are used, it is determined whether the cell layout is the same as that of the normal word line before replacement. If the cell layout is different, the rewrite operation is executed in accordance with the operation reverse to that in selecting the normal word line. Hence, even when the cell layout of the redundant word line is different from that of the normal word line before replacement, error correction can properly be executed, as in the above embodiments.

The fifth embodiment can also be applied to a device having twisted bit lines. In this case, it is determined, e.g., whether the cell layout of the normal word line before replacement is the same as that of the redundant word line after replacement. In addition, it is also determined, e.g., whether the selected row (word line) crosses a negative-phase column and whether the selected column (bit line) is the negative-phase column. Then, the rewrite operation is reversed.

SIXTH EMBODIMENT

A semiconductor memory with an ECC function, to which the above-described embodiments can be applied, will be described as the sixth embodiment of the present invention.

Figure 22:
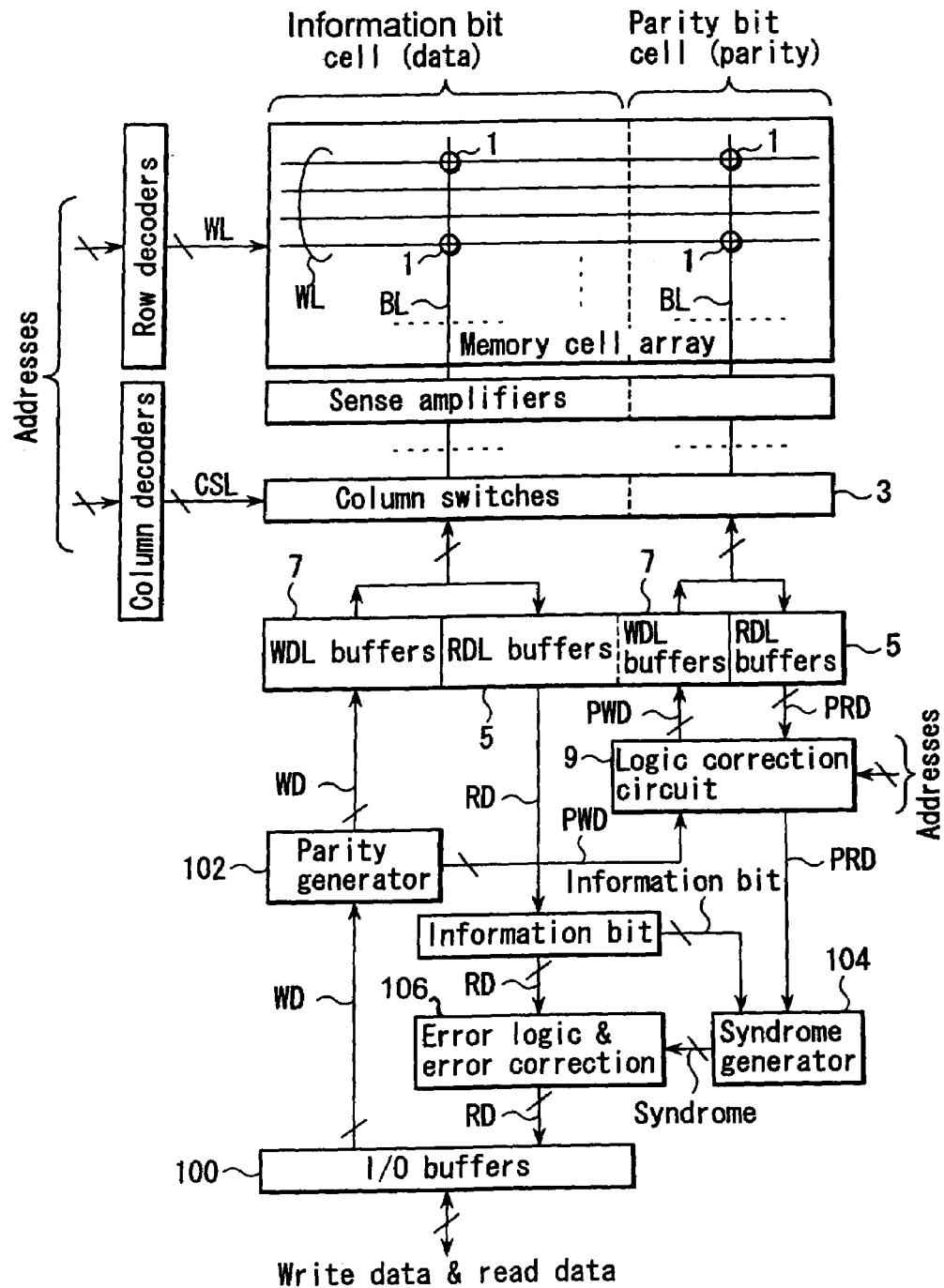
FIG. 22 is a block diagram showing an example of the structure of a semiconductor memory according to the sixth embodiment of the present invention.

FIG. 22 is a block diagram showing an example of the structure of a semiconductor memory according to the sixth embodiment of the present invention.

The semiconductor memory according to the sixth embodiment will be described using some operation examples.

(First Write Operation)

Figure 23:
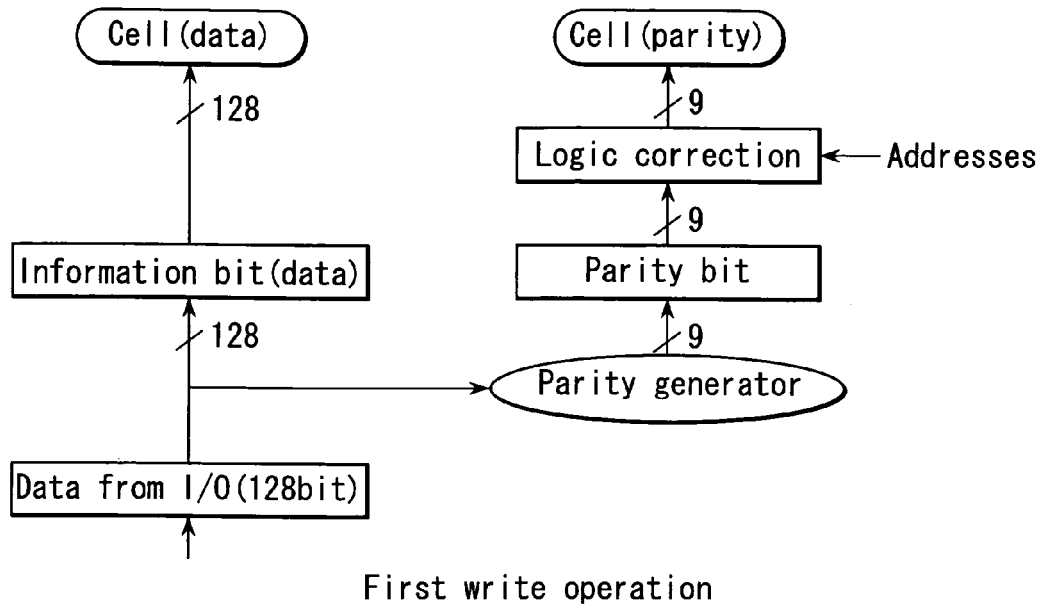
FIG. 23 is a flow chart showing the first write operation of the semiconductor memory shown in FIG. 22.

FIG. 23 is a flow chart showing the first write operation of the semiconductor memory shown in FIG. 22.

As shown in FIG. 23, for example, when the I/O width is 128 bits, 128-bit write data is input from an external I/O line (or an internal I/O line if the semiconductor memory is embedded in a system LSI) through an I/O buffer 100 (data from I/O (128 bits)). When an extended Hamming code is used, a parity generator 102 generates nine parity bits (parity bit) from the 128-bit write data. The nine parity bits are subjected to logic correction by a logic correction circuit 9 on the basis of addresses in accordance with the above embodiment and written in memory cells (cell (parity)) designated by addresses. The 128-bit write data is also written in memory cells (cell (data)) designated by addresses as 128 information bits. Since the minimum distance of the extended Hamming code of this example is "4", "1" error correction and "2" error detection can be executed.

(Read Operation)

Figure 24:
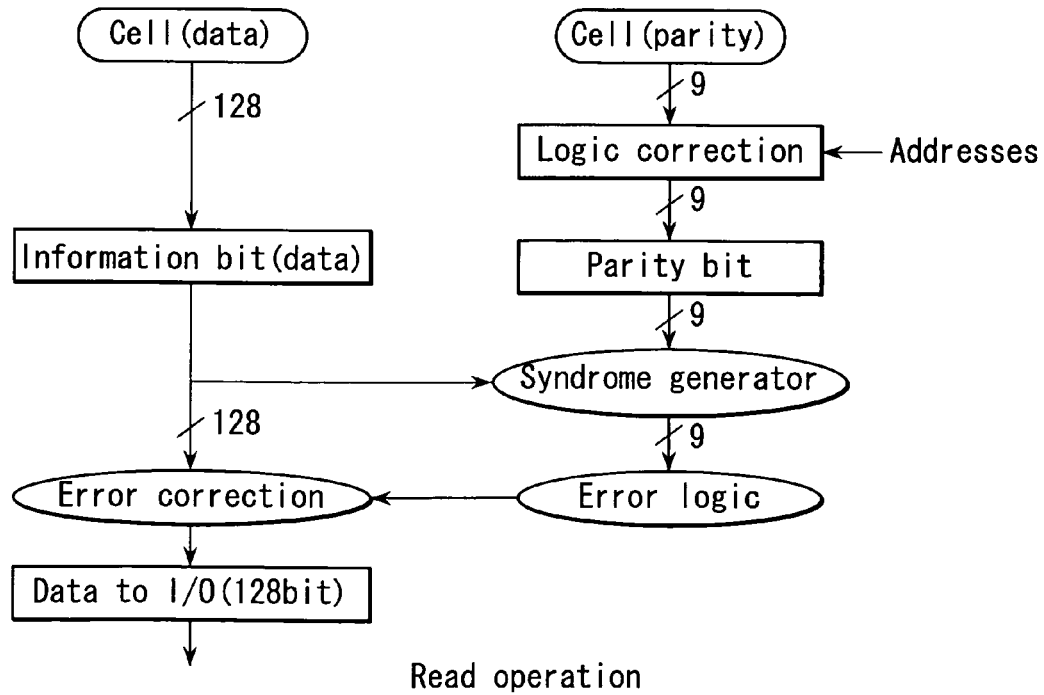
FIG. 24 is a flow chart showing the read operation of the semiconductor memory shown in FIG. 22.

FIG. 24 is a flow chart showing the read operation of the semiconductor memory shown in FIG. 22.

As shown in FIG. 24, 128 information bits (information bit (data)) are read out from the memory cells (cell (data)). Nine parity bits (parity bit) are read out from the memory cells (cell (parity)). The nine parity bits are subjected to logic correction by the logic correction circuit 9 on the basis of addresses in accordance with the above embodiment and input to a syndrome generator 104. The syndrome generator 104 generates a 9-bit syndrome signal from the 128 information bits and nine parity bits. An error logic & error correction circuit 106 detects from the 9-bit syndrome signal whether the information bits have errors. If an error is detected, the information bit error is corrected. The corrected information bits are output to the external I/O (or the internal I/O) through the I/O buffer 100 as 128-bit read data.

(Second Write Operation)

Figure 25:
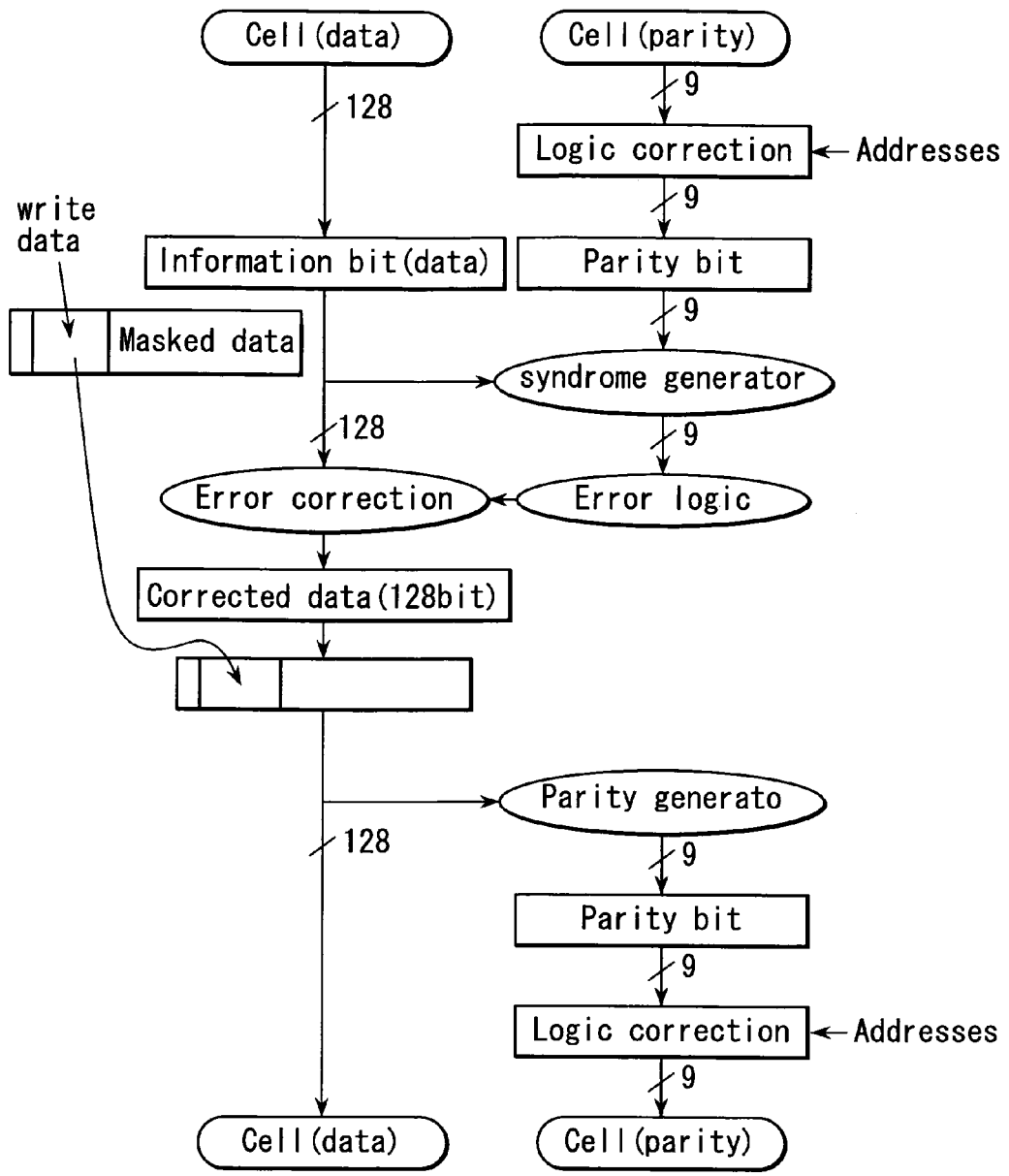
FIG. 25 is a flow chart showing the second write operation of the semiconductor memory shown in FIG. 22.

FIG. 25 is a flow chart showing the second write operation of the semiconductor memory shown in FIG. 22.

The second write operation assumes that a write mask is present (or I/O<128 bits).

As shown in FIG. 25, in accordance with the first read operation shown in FIG. 24, (128-bit+9-bit) data is read out from memory cells (cell (data)) and memory cells (cell (parity)). Error detection and correction are executed to create 128-bit corrected data. The 128-bit corrected data is combined with write-masked write data smaller than 128 bits to create 128 new information bits. In accordance with the first write operation shown in FIG. 23, 9-bit parity data is generated from the 128 new information bits. The information bits are written in the memory cells (cell (data)), and the parity bits are written in the memory cells (cell (parity)).

(Third Write Operation)

Figure 26:
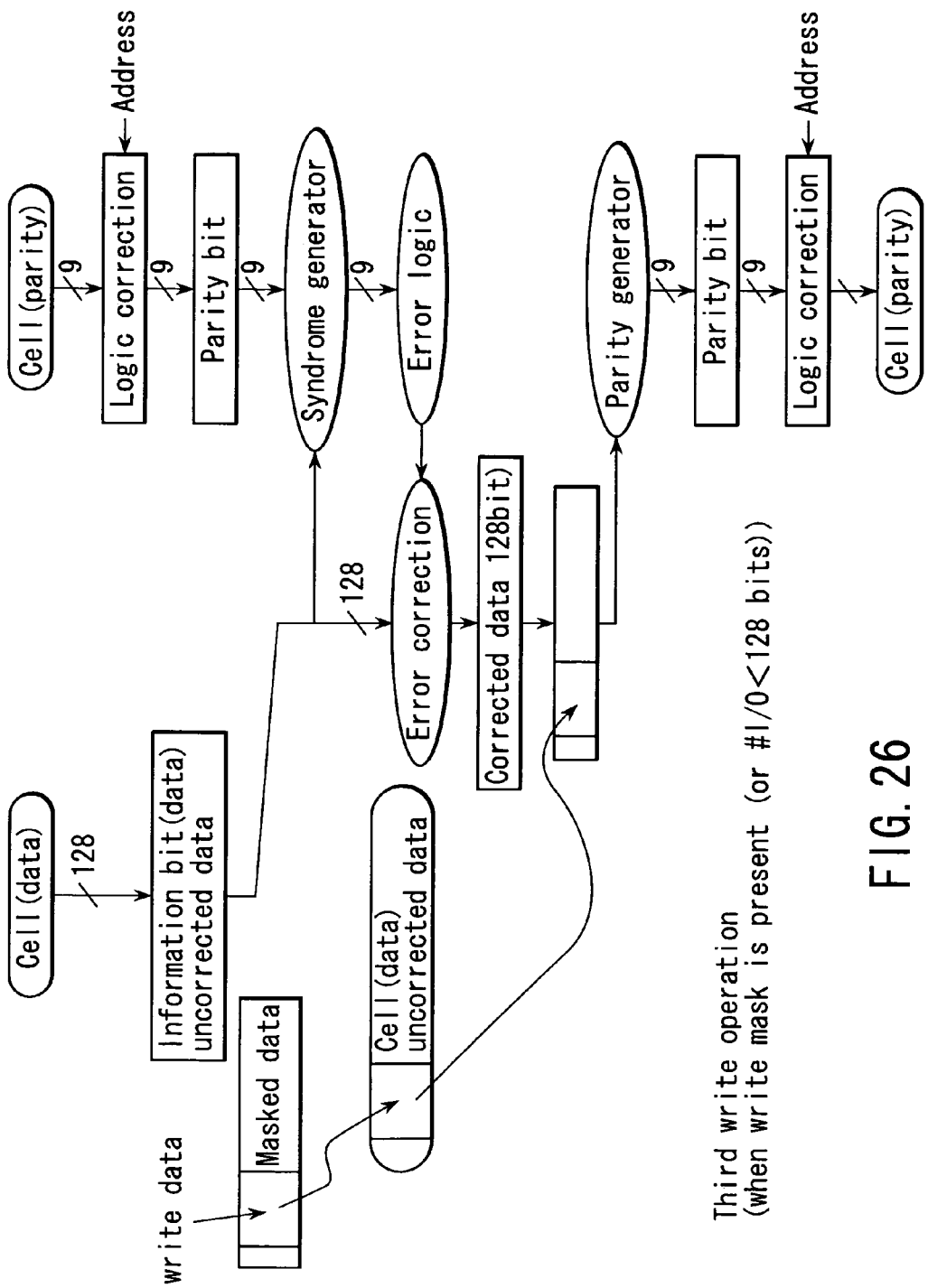
FIG. 26 is a flow chart showing the third write operation of the semiconductor memory shown in FIG. 22.

FIG. 26 is a flow chart showing the third write operation of the semiconductor memory shown in FIG. 22.

The third write operation assumes that a write mask is present (or I/O width<internal information bit width; 128 bits in this example), as in the second write operation.

As shown in FIG. 26, (128-bit+9-bit) data is read out from memory cells (cell (data)) and memory cells (cell (parity)). This process is the same as in the second write operation. In the third write operation, immediately after that, the write data is written in the memory cells (cell (data)). Of the 128 written information bits, masked data is uncorrected data. Next, the (128-bit+9-bit) data read first is subjected to error detection and correction to create corrected data (128 bits). The corrected data is combined with the write data to create 128 information bits. Nine parity bits are generated from the 128 created information bits. Only the parity bits are written in the memory cells (cell (parity)). Such an operation is performed to quickly write the information bits in the memory cells.

Figure 27:
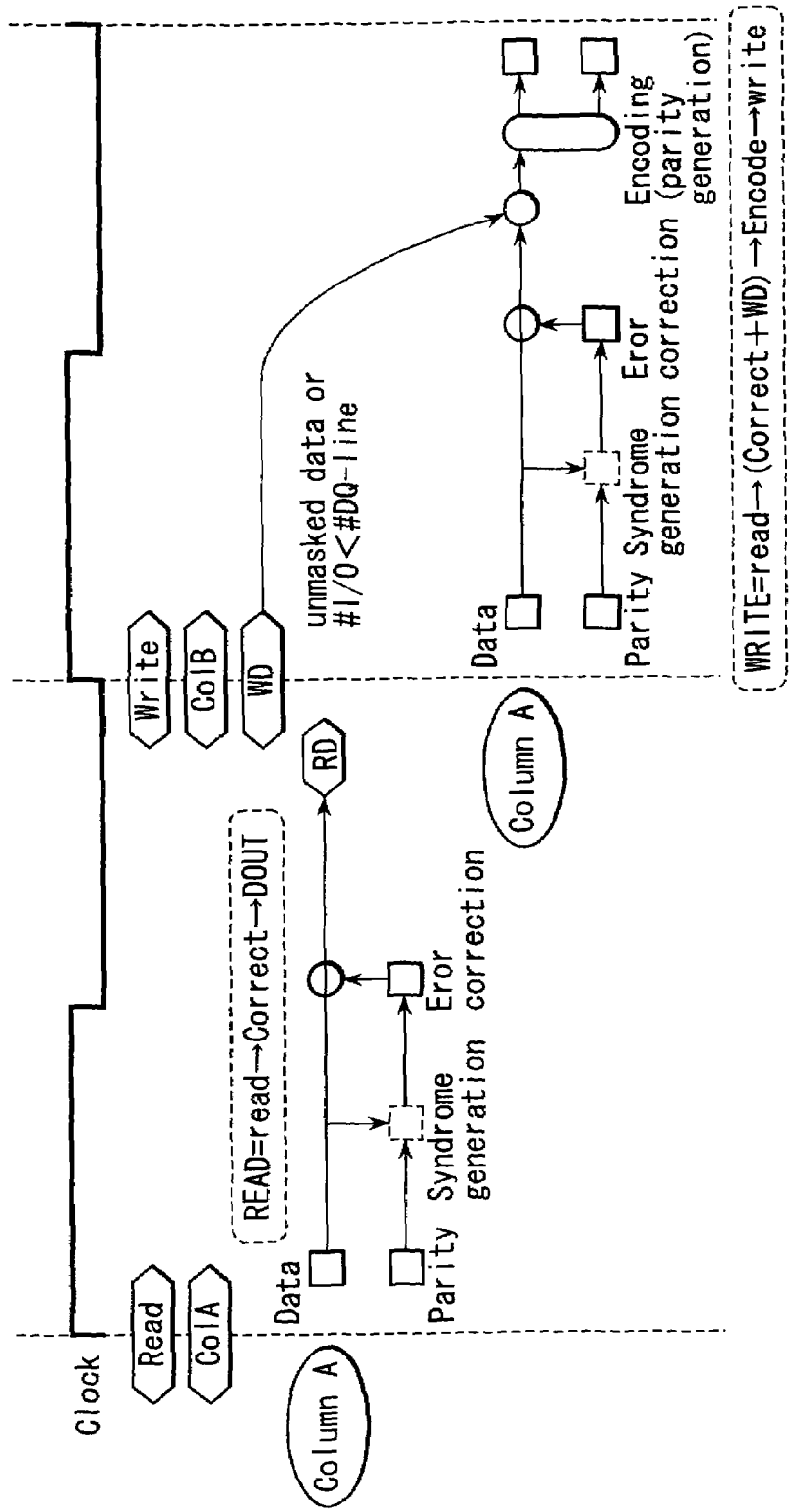
FIG. 27 is a view showing an example of write timing corresponding to the second write operation shown in FIG. 25.

FIG. 27 is a view showing an example of write timing corresponding to the second write operation shown in FIG. 25.

As shown in FIG. 27, the read operation is performed in the first clock, and the second write operation shown in FIG. 25 is performed in the next clock. There is a limit in completing this write operation in one clock because the read, error correction, information bit generation, parity bit generation, and write of the information bits and parity bits in the memory cells are performed.

Figure 28:
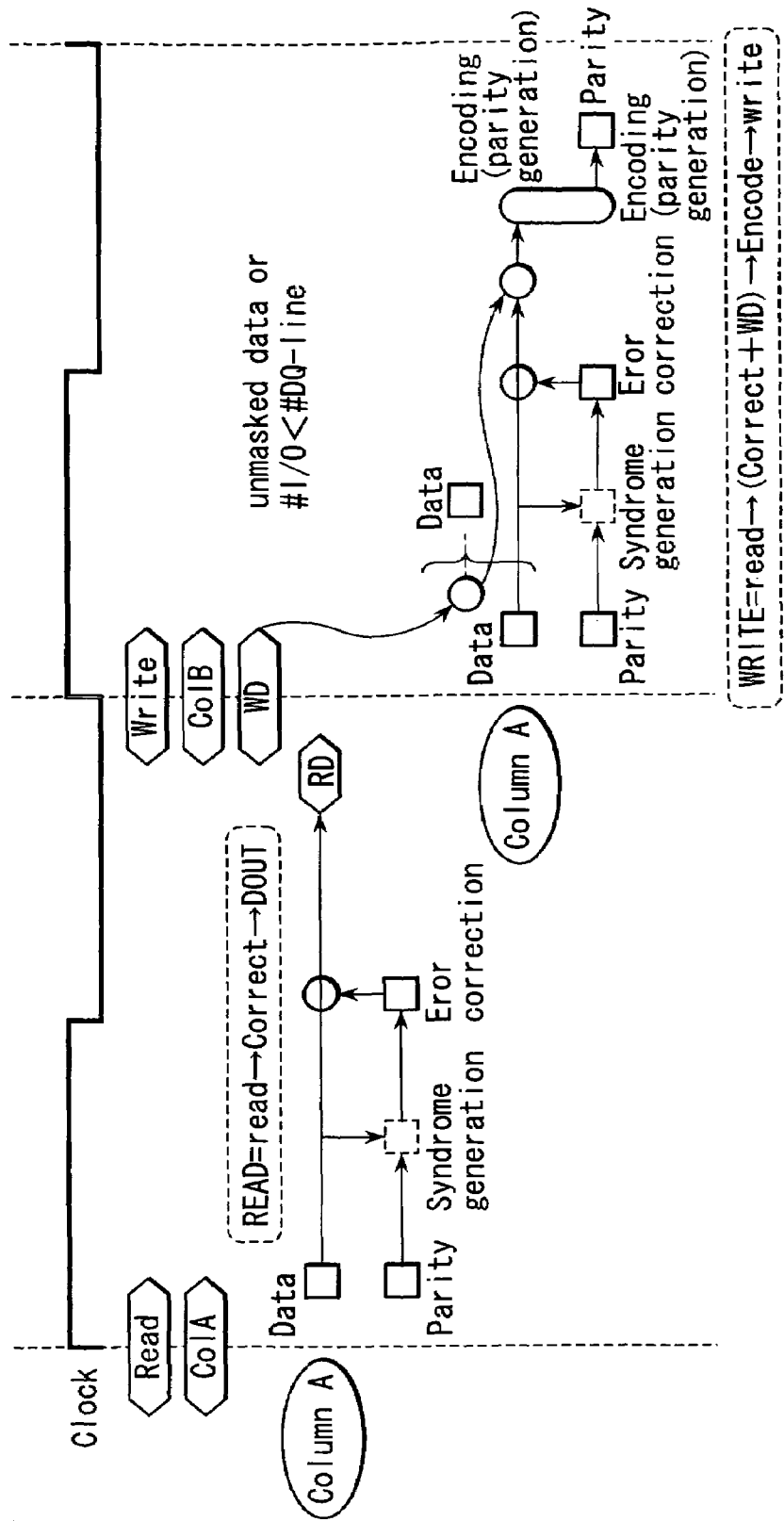
FIG. 28 is a view showing an example of write timing corresponding to the third write operation shown in FIG. 26.

FIG. 28 is a view showing an example of write timing corresponding to the third write operation shown in FIG. 26.

As shown in FIG. 28, the read operation is performed in the first clock, and the third write operation shown in FIG. 26 is performed in the next clock. The write timing of the operation in one clock is not so largely different from that shown in FIG. 27. However, when a late write operation to be described next is executed, the time necessary for correction and re-encoding in the parity portion can apparently be eliminated.

Figure 29:
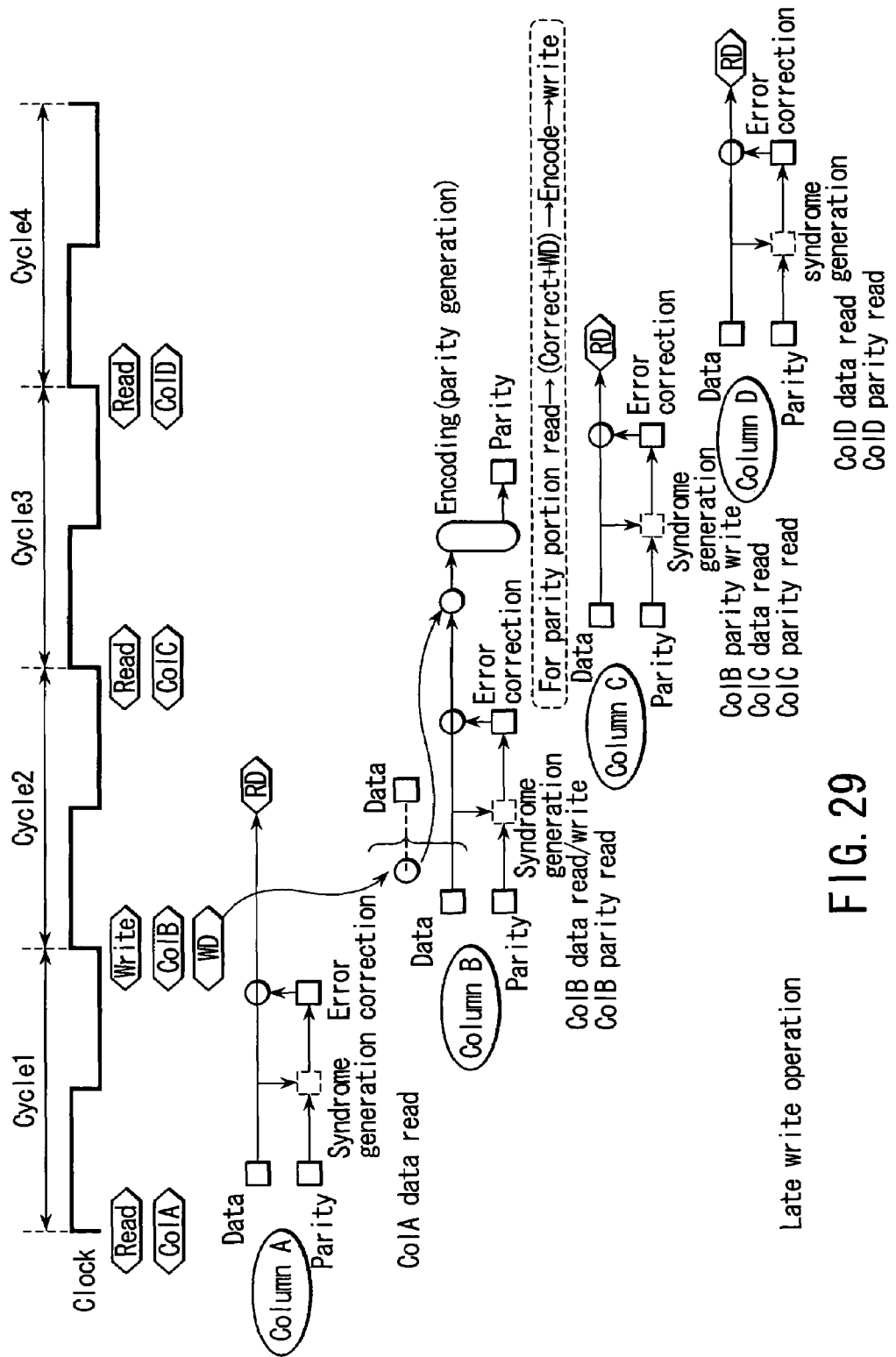
FIG. 29 is a view showing an example of write timing corresponding to the late write operation using the third write operation shown in FIG. 26.

FIG. 29 is a view showing an example of write timing corresponding to the late write operation using the third write operation shown in FIG. 26.

As shown in FIG. 29, the parity portion encoding operation in the third write operation shown in FIG. 28 is shifted behind by one clock cycle. For example, the read (or write) of cycle 3 overlaps the read for a parity portion of another address. These operations can be executed in the same cycle by employing DQ lines or sense amplifiers having dual ports. Not only the parity portion but also the information bit portion can have a dual port structure.

An erroneous error correction operation in reading out data from memory cells in the initial state readily occurs especially when the third write operation shown in FIG. 26 is used.

Figure 30:
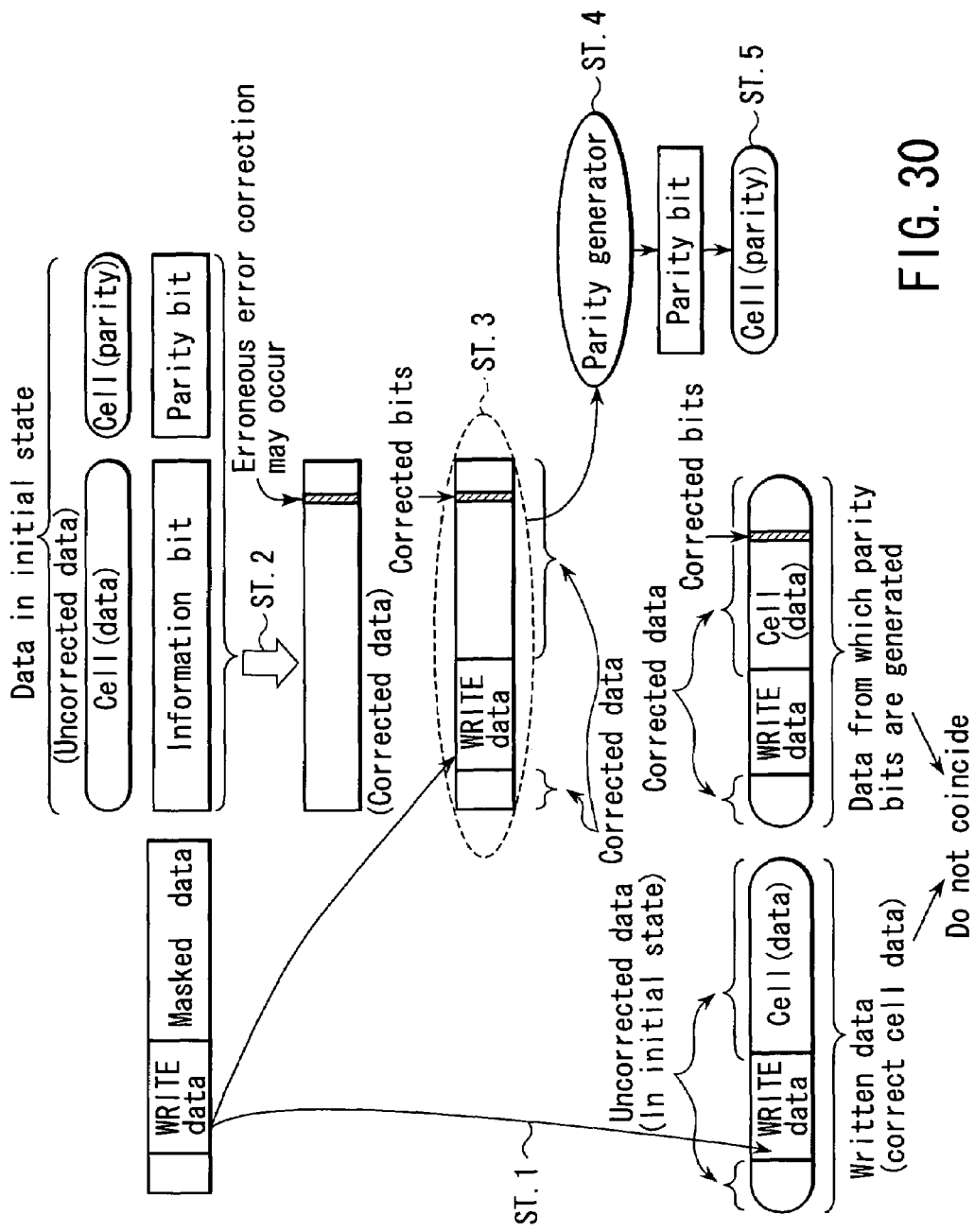
FIG. 30 is a view for explaining a disadvantage when the third write operation is used.

FIG. 30 is a view for explaining a disadvantage when the third write operation is used.

As shown in FIG. 30, in the third write operation, to quickly write information bits in memory cells, they are written in the memory cells in a state in which write data is overwritten on part of uncorrected data read out from the memory cells (ST.1). After that, ECC is executed for the uncorrected data (ST.2). The write data is overwritten on part of the data (corrected data) which has undergone ECC (ST.3). Then, parity bits are generated from the data obtained by overwriting the write data on part of the data which has undergone ECC (ST.4). The generated parity bits are written in the memory cells (cell (parity)) (ST.5).

As described above, in the third write operation, the processing executed for the data actually written in the memory cells (cell (data)) is different from the processing executed for the data from which the parity bits are generated.

If the memory cells are in the initial state, the data of the memory cells and, for example, data corresponding to the parity bits are not always correct, as described in the above embodiments. For this reason, when data is read out from the memory cells in the initial state, erroneous error correction may occur. When erroneous error correction occurs, the data from which the parity bits are generated does not coincide with the data (correct cell data) actually written in the memory cells. As a result, in the next read, error correction is executed for the correct cell data. The correct cell data is rewritten so that the write data and read data do not coincide.

Figure 31:
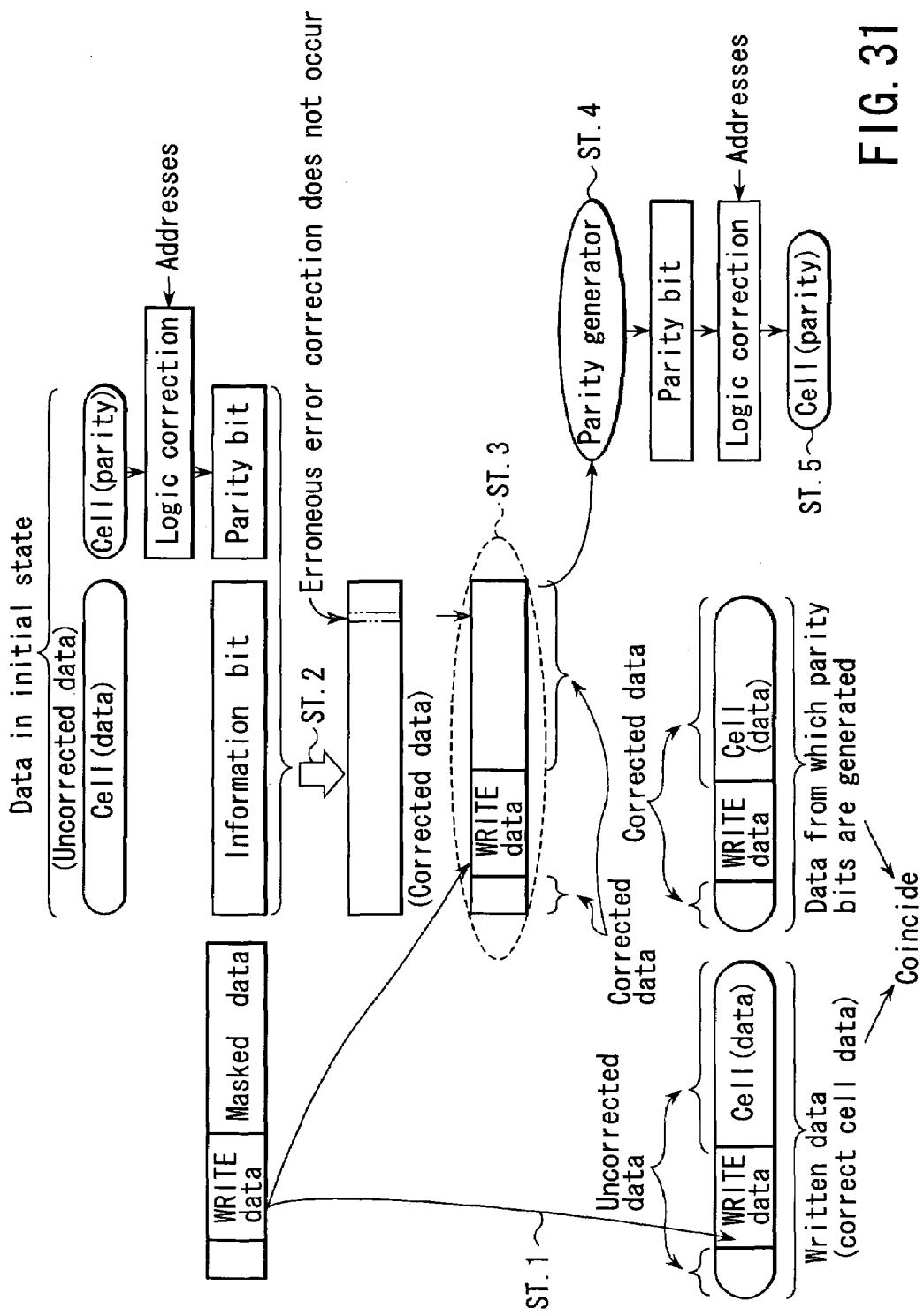
FIG. 31 is a view for explaining an advantage when the embodiment of the present invention is applied to the third write operation.

FIG. 31 is a view for explaining an advantage when the embodiment of the present invention is applied to the third write operation.

As shown in FIG. 31, when the embodiment of the present invention is applied to the third write operation, no erroneous error correction occurs even when data is read out from the memory cells in the initial state. Since no erroneous error correction occurs, the data from which the parity bits are generated coincides with the data (correct cell data) actually written in the memory cells. Hence, in the next read, the correct cell data is not rewritten so that the write data coincides with the read data. That is, even when the data is read out from the memory cells in the initial state, error correction can properly be executed.

As described above, the embodiment of the present invention can particularly advantageously be applied to a write operation in which, for example, after data is written in memory cells in a state in which write data is overwritten on part of uncorrected data, ECC is executed for the uncorrected data, and parity bits are generated from the data obtained by overwriting the write data on part of the corrected data which has undergone ECC.

This example has been described assuming that a read instruction follows a write instruction, as shown in FIG. 29. In this case, during a series of write operations according to the first write instruction, a write operation according to the next read instruction is executed. In the example shown in FIG. 29, during the write of parity bits for an address according to the first write instruction, the read for another address according to the next read instruction is executed, as in the third cycle (cycle 3) in FIG. 29.

However, the write operation may sometimes be executed consecutively two or more times. In this case, during the series of write operations according to the first write instruction, the series of write operations according to the next and subsequent write instructions are executed. For example, during the write of parity bits for an address corresponding to the first write instruction, a read, overwrite, and parity bit generation for another address according to the next write instruction are executed.

The following operations may be executed depending on the number of pipeline stages in the semiconductor integrated circuit device.

(1) During parity bit generation for an address according to the first write instruction, a read and overwrite for another address according to the next write instruction are executed.

(2) Following (1), during the write of parity bits for an address according to the first write instruction, parity bit generation for another address according to the next write instruction and a read and overwrite for still another address according to the write instruction after the next are executed.

That is, during a series of write operations for an address according to a write instruction, e.g., during a write of parity bits, a series of write operations for another address corresponding to a write instruction following the first write instruction or a read operation for another address-according to a read instruction following the first write instruction is executed.

According to the embodiment of the present invention, a semiconductor integrated circuit device capable of properly executing error correction even when data is read out from memory cells in the initial state can be provided.

The present invention has been described above in accordance with the embodiments. However, the present invention is not limited to the above embodiments, and various changes and modifications can be made within the spirit and scope of the present invention.

For example, in the above embodiments, a dynamic volatile memory cell used in, e.g., a DRAM has been exemplified as a memory cell. However, the memory cell is not limited to a dynamic memory cell. For example, the present invention can also be applied to a nonvolatile semiconductor memory having nonvolatile memory cells which have a charge accumulation layer and store data in accordance with a threshold value, nonvolatile memory cells which store data by using the hysteresis characteristic of a ferroelectric body, or nonvolatile memory cells which store data by using a magneto-resistance effect. A nonvolatile semiconductor memory continues to hold data even after power-off. Hence, it seems as if the above embodiments need not be applied. However, even in a nonvolatile semiconductor memory, for example, data initialization (all data clear) may be executed. In the read after initialization, the data of memory cells, e.g., the data corresponding to parity bits is not always correct, as described in the above embodiments. Hence, the above embodiments can also be applied to a nonvolatile semiconductor memory.

As an error correcting code, a Hamming code or extended Hamming code is used. However, the error correcting code is not limited to a Hamming code or extended Hamming code. For example, the error correcting code may be a BCH code or any other code.

Each of the above embodiments can independently be practiced. However, they may appropriately be combined.

The embodiments incorporate inventions of various stages, and inventions of various stages can be extracted by appropriately combining a plurality of constituent elements disclosed in the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device, comprising:
a first word line and a second word line, which are selected on the basis of an address;
a pair of complementary bit lines for information bits;
a pair of complementary bit lines for parity bits;
a first memory cell coupled to the first word line and one of the pair of complementary bit lines for information bits;
a second memory cell coupled to the first word line and one of the pair of complementary bit lines for parity bits;
a third memory cell coupled to the second word line and another of the pair of complementary bit lines for information bits;
a fourth memory cell coupled to the second word line and another of the pair of complementary bit lines for parity bits;
column switches which connect the pair of complementary bit lines for information bits to a pair of data lines for information bits and the pair of complementary bit lines for parity bits to a pair of data lines for parity bits; and
a logic correction circuit connected to one of the pair of data lines for parity bits, the logic correction circuit executing a parity bit rewrite operation in which, on the basis of the address, a logic of data read out from the data lines for parity bits is inverted in a data read operation, and a logic of data to be written in the data lines for parity bits is inverted in a data write operation,
wherein the pair of complementary bit lines for information bits and the pair of complementary bit lines for parity bits are twisted bit lines,
the logic correction circuit determines whether a selected word line crosses a reversed phase column and whether a selected column is the reversed phase column, and,
when the selected word line crosses the reversed phase column, and the selected column is the reversed phase column, the logic correction circuit does not execute the parity bit rewrite operation.

2. A semiconductor integrated circuit device, comprising:
a first word line and a second word line, which are selected on the basis of an address;
a pair of complementary bit lines for information bits;
a pair of complementary bit lines for parity bits;
a first memory cell coupled to the first word line and one of the pair of complementary bit lines for information bits;
a second memory cell coupled to the first word line and one of the pair of complementary bit lines for parity bits;
a third memory cell coupled to the second word line and another of the pair of complementary bit lines for information bits;
a fourth memory cell coupled to the second word line and another of the pair of complementary bit lines for parity bits;
column switches which connect the pair of complementary bit lines for information bits to a pair of data lines for information bits and the pair of complementary bit lines for parity bits to a pair of data lines for parity bits;
a logic correction circuit connected to one of the pair of data lines for parity bits, the logic correction circuit executing a parity bit rewrite operation in which, on the basis of the address, a logic of data read out from the data lines for parity bits is inverted in a data read operation, and a logic of data to be written in the data lines for parity bits is inverted in a data write operation;
a redundant word line; and
a redundancy circuit which replaces a word line before replacement with the redundant word line, wherein the logic correction circuit determines whether the redundant word line is selected on the basis of the address and whether a layout of memory cells of the redundant word line is the same as that of the word line before replacement, and
when the redundant word line is selected, and the layout of the memory cells of the redundant word line is different from that of the word line before replacement, the logic correction circuit executes the parity bit rewrite operation in accordance with an operation reverse to that in selecting the word line before replacement.

* * * * *